US011177282B2

(12) United States Patent
Jung et al.

(10) Patent No.: US 11,177,282 B2
(45) Date of Patent: *Nov. 16, 2021

(54) SEMICONDUCTOR DEVICES

(71) Applicant: Samsung Electronics Co., Ltd., Suwon-si (KR)

(72) Inventors: Kwangyoung Jung, Hwaseong-si (KR); Jongwon Kim, Hwaseong-si (KR); Dongseog Eun, Seongnam-si (KR); Joonhee Lee, Seongnam-si (KR)

(73) Assignee: Samsung Electronics Co., Ltd.

( * ) Notice: Subject to any disclaimer, the term of this patent is extended or adjusted under 35 U.S.C. 154(b) by 0 days.

This patent is subject to a terminal disclaimer.

(21) Appl. No.: 16/921,185

(22) Filed: Jul. 6, 2020

(65) Prior Publication Data
US 2020/0335520 A1   Oct. 22, 2020

Related U.S. Application Data

(63) Continuation of application No. 15/955,256, filed on Apr. 17, 2018, now Pat. No. 10,741,574.

(30) Foreign Application Priority Data

Jul. 25, 2017   (KR) .................... 10-2017-0094394

(51) Int. Cl.
| H01L 27/11582 | (2017.01) |
| H01L 27/11568 | (2017.01) |
| H01L 21/768 | (2006.01) |
| H01L 23/522 | (2006.01) |
| H01L 23/528 | (2006.01) |

(Continued)

(52) U.S. Cl.
CPC .. *H01L 27/11582* (2013.01); *H01L 21/76816* (2013.01); *H01L 21/76877* (2013.01); *H01L 23/528* (2013.01); *H01L 23/5226* (2013.01); *H01L 27/11565* (2013.01); *H01L 27/11568* (2013.01); *H01L 27/11575* (2013.01)

(58) Field of Classification Search
CPC ......... H01L 27/11582; H01L 27/11575; H01L 27/11565; H01L 23/528; H01L 21/76816; H01L 23/5226; H01L 21/76877; H01L 27/11568; H01L 23/481; H01L 21/4814
See application file for complete search history.

(56) References Cited

U.S. PATENT DOCUMENTS

| 9,214,409 B2 | 12/2015 | Jin-Hyuk et al. |
| 9,343,452 B2 | 5/2016 | Tae-Hwan et al. |
| 9,362,306 B2 | 6/2016 | Park et al. |

(Continued)

FOREIGN PATENT DOCUMENTS

| KR | 10-2011-0015337 | 2/2011 |
| KR | 20160094827 A | 8/2016 |

*Primary Examiner* — Bac H Au
(74) *Attorney, Agent, or Firm* — Myers Bigel, P.A.

(57) ABSTRACT

Semiconductor devices are provided. A semiconductor device includes a substrate. The semiconductor device includes a stack structure including conductive layers stacked on the substrate. Moreover, the semiconductor device includes a dummy structure penetrating a stepped region of the stack structure. A portion of the dummy structure includes a first segment and a second segment. The first segment extends in a first direction in a plane parallel to an upper surface of the substrate. The second segment protrudes from the first segment in a second direction, in the plane, that intersects the first direction.

20 Claims, 26 Drawing Sheets

(51) Int. Cl.
*H01L 27/11565* (2017.01)
*H01L 27/11575* (2017.01)

(56) References Cited

U.S. PATENT DOCUMENTS

| | | |
|---|---|---|
| 9,419,008 B2 | 8/2016 | Jung-Ik et al. |
| 9,478,561 B2 | 10/2016 | Chaeho et al. |
| 9,559,049 B1 | 1/2017 | Yuan-Chieh et al. |
| 9,646,981 B2 | 5/2017 | Masatoshi et al. |
| 9,716,104 B2 | 7/2017 | Won et al. |
| 9,812,461 B2 | 11/2017 | Yasushi et al. |
| 9,960,181 B1 | 5/2018 | Zhixin et al. |
| 10,381,369 B2 | 8/2019 | Hongsoo et al. |
| 2015/0372101 A1 | 12/2015 | Goo et al. |
| 2016/0365352 A1 | 12/2016 | Masatoshi et al. |
| 2017/0077026 A1 | 3/2017 | Takamasa et al. |
| 2017/0077137 A1 | 3/2017 | Jeong et al. |
| 2017/0236746 A1 | 8/2017 | Yu et al. |
| 2018/0350831 A1 | 12/2018 | Won et al. |
| 2018/0366487 A1 | 12/2018 | Yasuchika et al. |

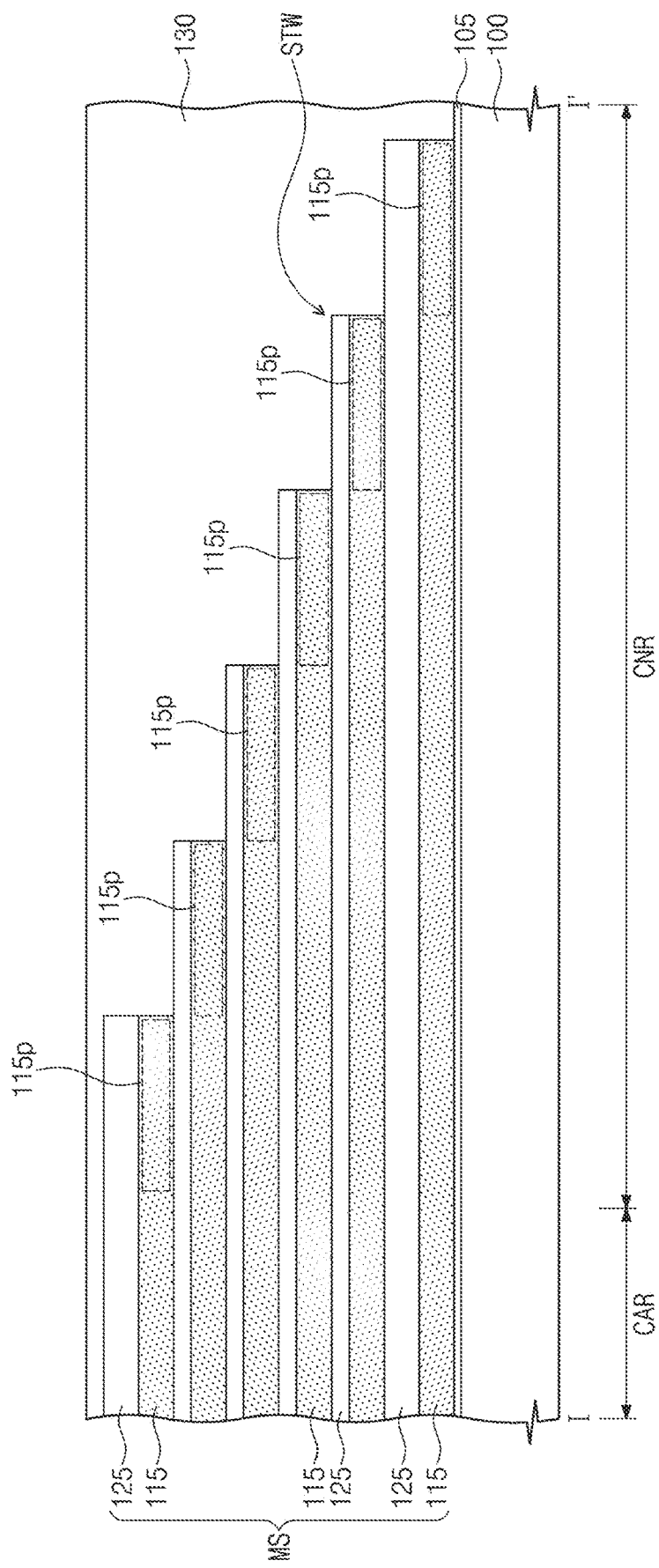

SEMICONDUCTOR DEVICES

CROSS-REFERENCE TO RELATED APPLICATIONS

This U.S. non-provisional patent application is a continuation of U.S. patent application Ser. No. 15/955,256, filed Apr. 17, 2018, which itself claims priority under 35 U.S.C § 119 to Korean Patent Application No. 10-2017-0094394, filed on Jul. 25, 2017, the entire contents of both of which are hereby incorporated by reference herein.

BACKGROUND

The present inventive concepts relate to a semiconductor device and a method of fabricating the same, and more particularly, to a three-dimensional semiconductor device and a method of fabricating the same.

Semiconductor devices have been highly integrated due to demand by users for high performance and low manufacturing costs. Since integration of semiconductor devices may be a factor in determining product price, high integration may be strongly demanded. Integration of typical two-dimensional or planar semiconductor devices is primarily determined by the area occupied by a unit memory cell, such that it is greatly influenced by the level of technology for forming fine patterns. However, extremely expensive processing equipment may be used to produce fine patterns, which may set a practical limitation on increasing the integration of two-dimensional or planar semiconductor devices. Therefore, three-dimensional semiconductor devices having three-dimensionally-arranged memory cells have been proposed.

SUMMARY

Some embodiments of the present inventive concepts provide a semiconductor device having enhanced reliability.

An object of the present inventive concepts, however, is not limited to the mentioned above. Rather, other objects which have not been mentioned above will be clearly understood to those skilled in the art from the following description.

According to example embodiments of the present inventive concepts, a semiconductor device may include a substrate. The semiconductor device may include a stack structure including conductive layers stacked on the substrate. Moreover, the semiconductor device may include a dummy structure penetrating a stepped region of the stack structure. A portion of the dummy structure may include a first segment and a second segment. The first segment may extend in a first direction in a plane parallel to an upper surface of the substrate. The second segment may protrude from the first segment in a second direction, in the plane, that intersects the first direction.

According to example embodiments of the present inventive concepts, a semiconductor device may include a substrate including a cell array region and a connection region. The semiconductor device may include a stack structure including a plurality of conductive layers stacked on the substrate. A first one of the plurality of conductive layers may include a pad region that protrudes relative to an overlying second one of the plurality of conductive layers on the connection region. The semiconductor device may include a vertical structure on the cell array region and penetrating a vertical memory region of the stack structure. Moreover, the semiconductor device may include a support structure penetrating the pad region. In a horizontal cross section, a portion of the support structure may include an inwardly-curved segment.

According to example embodiments of the present inventive concepts, a semiconductor device may include a substrate including a cell array region and a connection region. The semiconductor device may include a stack structure including conductive layers stacked on the substrate. The conductive layers may include a stepped structure on the connection region. Moreover, the semiconductor device may include a support structure on the connection region and penetrating the stepped structure. The support structure may include a dummy lower semiconductor pattern on the substrate, and a dummy conductive pad on the dummy lower semiconductor pattern. In a horizontal cross sectional view, the dummy conductive pad may include a first segment extending in a first direction, and a second segment protruding in a second direction from the first segment. The second direction may cross the first direction.

Further details and further example embodiments are included in the description and drawings.

BRIEF DESCRIPTION OF THE DRAWINGS

FIGS. 4A, 5A, 6A, 7A, 8A, and 9A illustrate vertical sectional views showing a method of fabricating a semiconductor device according to example embodiments of the present inventive concepts.

DETAILED DESCRIPTION

Figure 1:
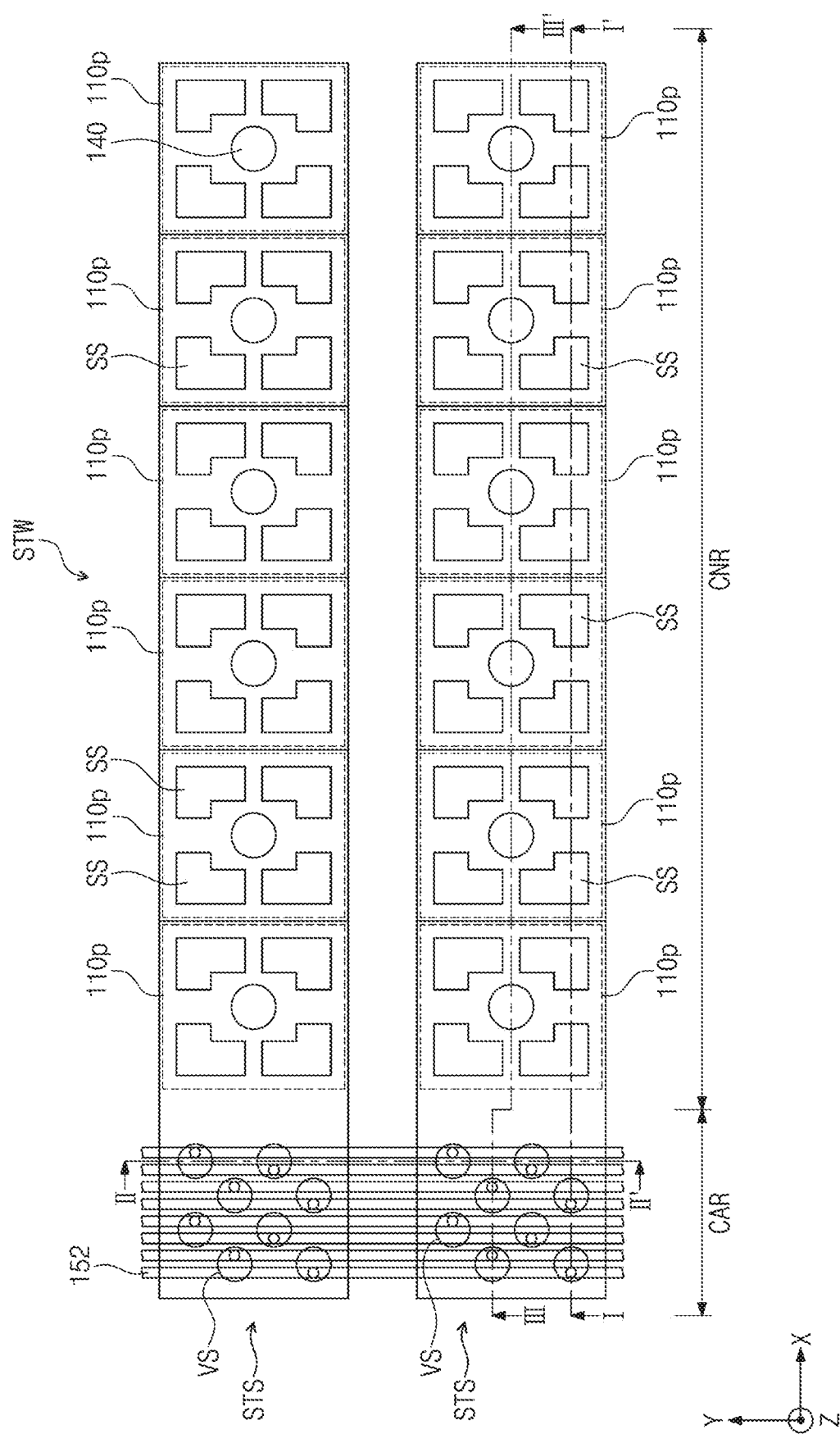
FIG. 1 illustrates a plan view showing a semiconductor device according to example embodiments of the present inventive concepts.

Example embodiments of the present inventive concepts will now be described more fully herein with reference to the accompanying drawings. The present inventive concepts may be embodied in many different forms, however, and should not be construed as limited to only example embodiments set forth herein. Like reference numerals indicate like components throughout the description herein.

Figure 2A:
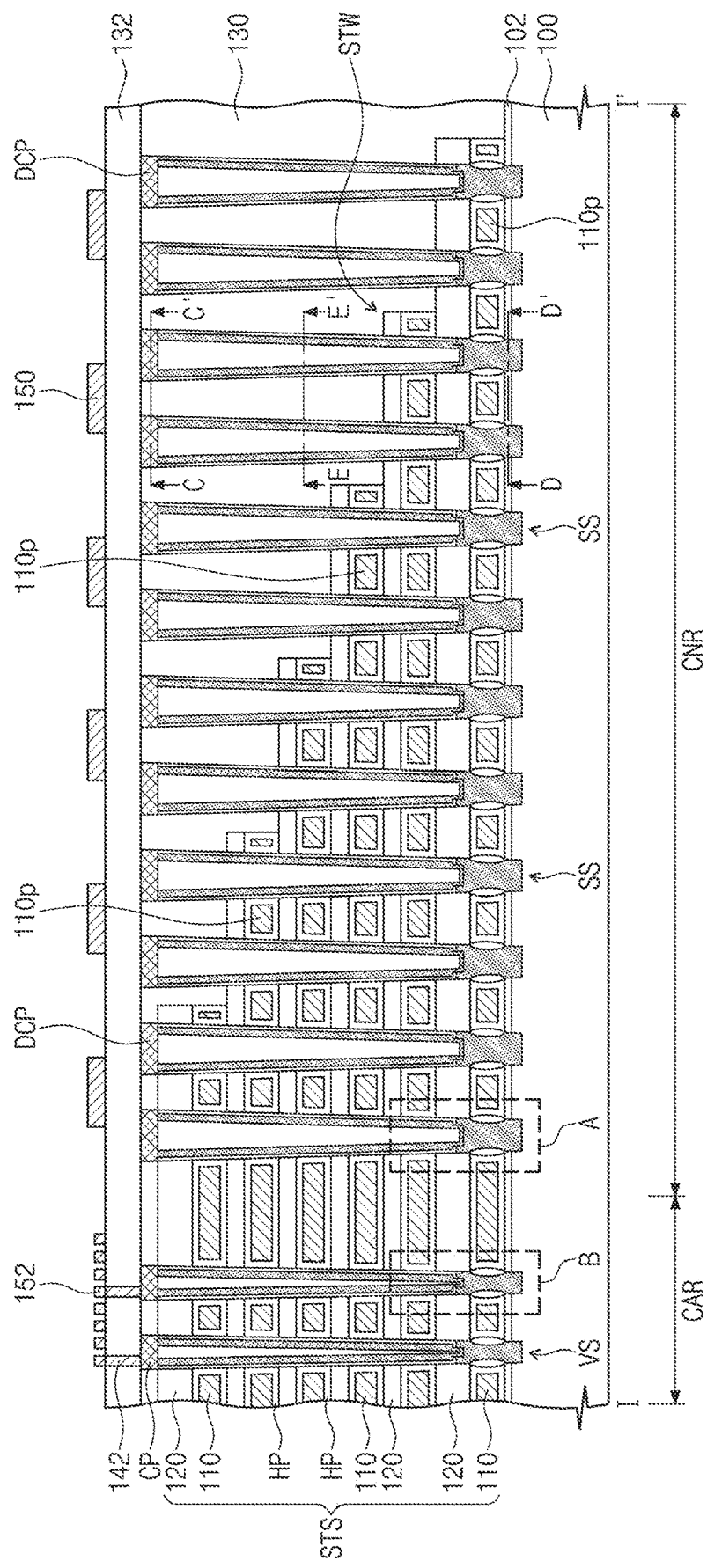
FIGS. 2A, 2B, and 2C illustrate vertical sectional views respectively taken along lines I-I', II-II', and III-III' of FIG. 1.
Figure 2B:
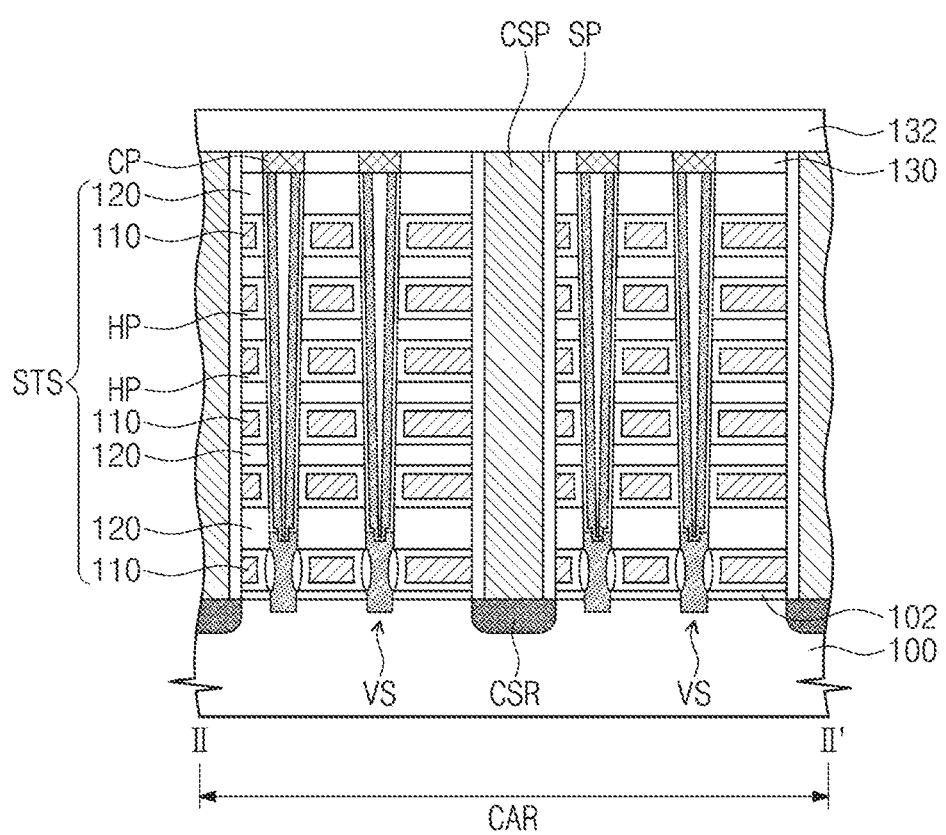
Figure 2C:
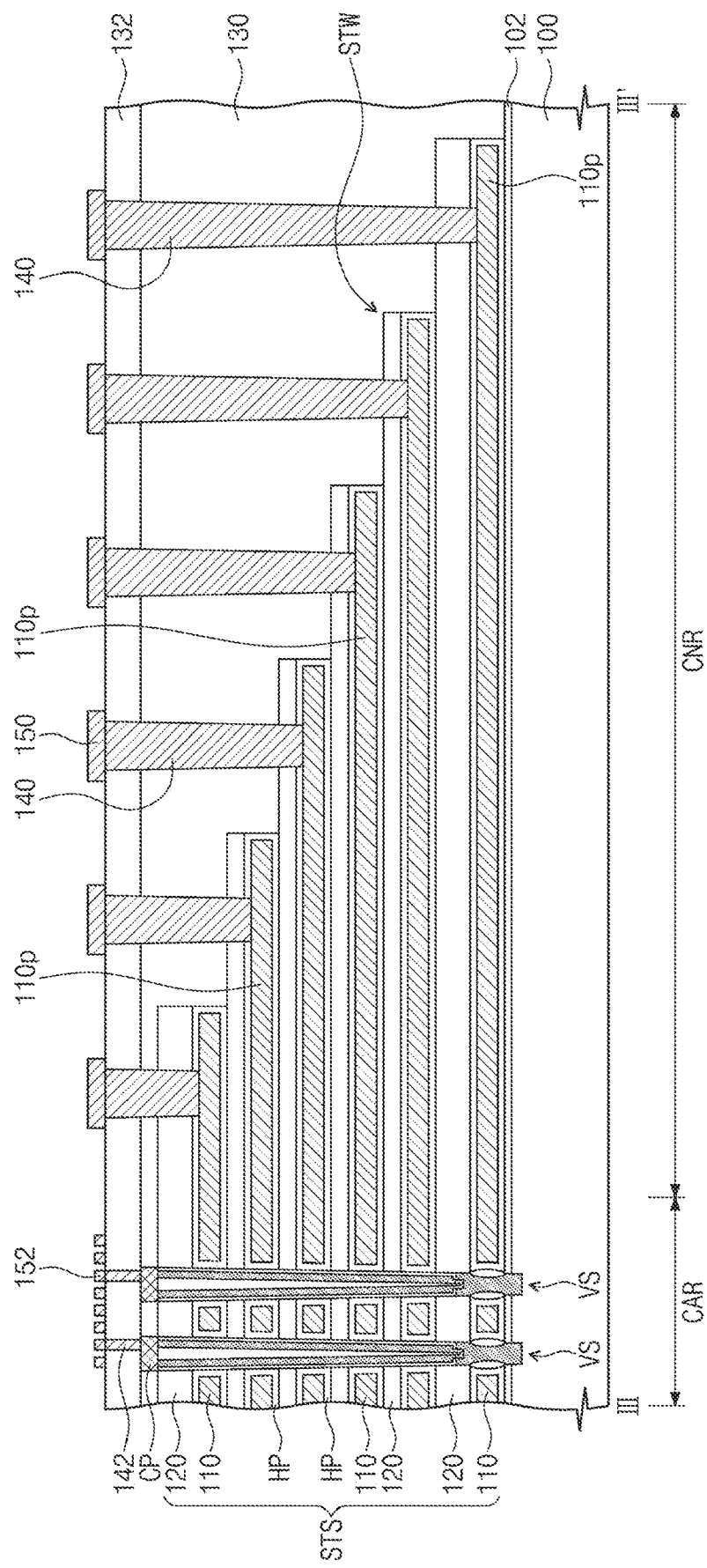
Figure 3A:
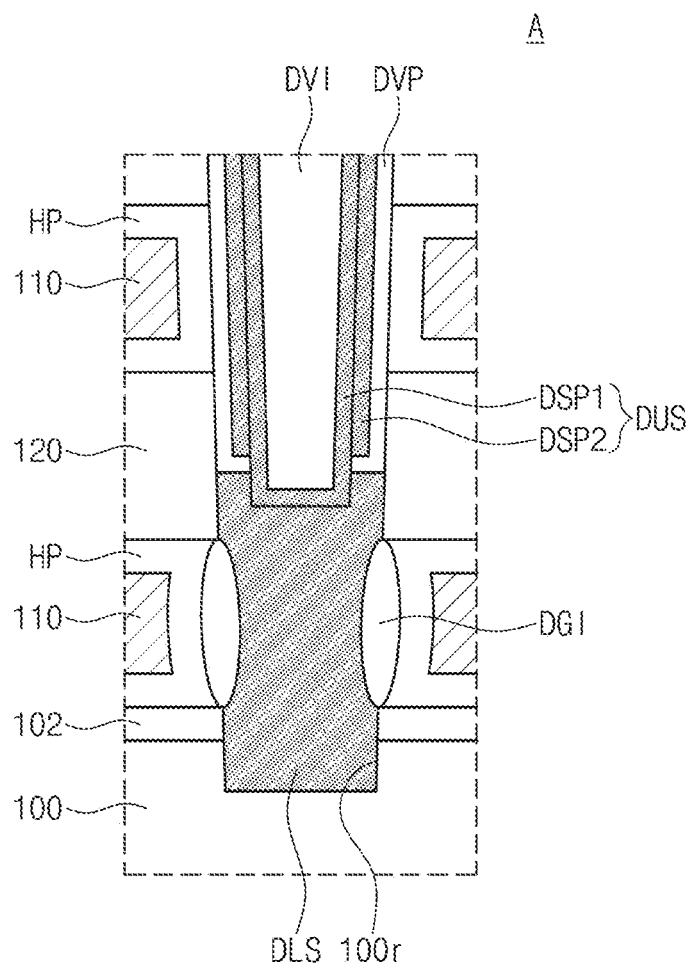
FIGS. 3A and 3B illustrate enlarged views respectively showing sections A and B of FIG. 2A.
Figure 3B:
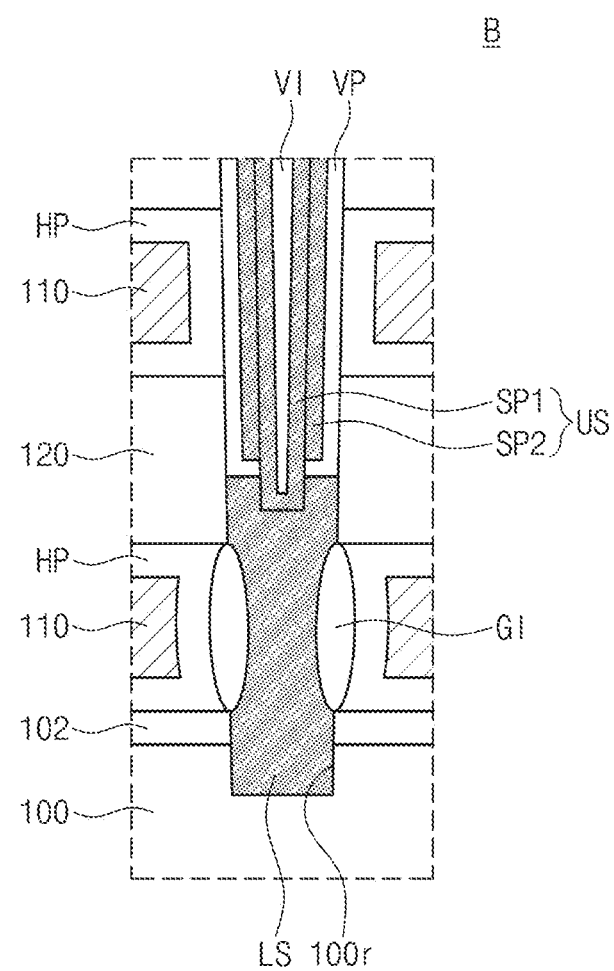

FIG. 1 illustrates a plan view showing a semiconductor device according to example embodiments of the present inventive concepts. FIGS. 2A, 2B, and 2C illustrate vertical sectional views respectively taken along lines I-I', II-II', and III-III' of FIG. 1. FIGS. 3A and 3B illustrate enlarged views respectively showing sections A and B of FIG. 2A. FIGS.

3C, 3D, and 3E illustrate horizontal sectional views respectively taken along lines C-C', D-D', and E-E' of FIG. 2A.

Referring to FIGS. 1 and 2A to 2C, a semiconductor device may include a substrate 100, stack structures STS, vertical structures VS, and support structures SS.

The substrate 100 may be a semiconductor substrate. For example, the substrate 100 may be a silicon substrate, a germanium substrate, a silicon-germanium substrate, an SOI (silicon-on-insulator) substrate, or a GOI (germanium-on-insulator) substrate. The substrate 100 may be, for example, a silicon wafer having a first conductive type (e.g., a p-type conductivity).

The substrate 100 may include a cell array region CAR and a connection region CNR. The cell array region CAR and the connection region CNR may be adjacent to each other.

The stack structures STS may be disposed on the substrate 100. The stack structures STS may extend side by side in an X direction (designated by symbol X of FIG. 1). The stack structures STS may be spaced apart from each other in a Y direction (designated by symbol Y of FIG. 1) crossing (e.g., perpendicular to or otherwise intersecting) the X direction. The X and Y directions may be parallel to a top surface of the substrate 100.

Each of the stack structures STS may include a plurality of conductive patterns 110 and a plurality of insulating patterns 120 that are alternately and repeatedly stacked. The insulating patterns 120 may electrically insulate the conductive patterns 110 from each other. A buffer pattern 102 may be provided between the substrate 100 and the stack structures STS. The buffer pattern 102 may have a thickness less than those of the insulating patterns 120. A bottommost insulating pattern 120 and a topmost insulating pattern 120 may have thicknesses greater than those of intervening insulating patterns 120 between the bottommost and topmost insulating patterns 120. The conductive patterns 110 may include a conductive material (e.g., tungsten), and the insulating patterns 120 and the buffer pattern 102 may include an insulating material (e.g., silicon oxide). The conductive patterns 110 may also be referred to herein as "conductive layers," respectively.

Each of the stack structures STS may extend onto the connection region CNR from the cell array region CAR of the substrate 100, and may have a stepwise (e.g., stepped) structure STW on the connection region CNR. For example, the stepwise structure STW of each of the stack structures STS may descend away from the cell array region CAR. In such a configuration, each of the conductive patterns 110 except for a topmost conductive pattern 110 may have a pad (e.g., a "pad region") 110p exposed by an overlying conductive pattern 110. The topmost conductive pattern 110 may have a pad 110p at its end portion on the connection region CNR. The stepwise structure STW may be referred to herein as a "stepped region" of a stack structure STS. Moreover, the non-stepped region/portion of the stack structure STS that is on the cell array region CAR of the substrate 100 may be referred to herein as a "vertical memory region" of the stack structure STS.

Common source regions CSR may be provided in portions of the substrate 100 that are exposed on opposite sides of each of the stack structures STS. For example, the common source regions CSR may be provided on the cell array region CAR between the stack structures STS spaced apart from each other in the Y direction. Each of the common source regions CSR may extend along the X direction. The common source regions CSR may be areas doped with an impurity having a second conductive type (e.g., an n-type conductivity) different from the first conductive type.

Common source plugs CSP may be provided on the common source regions CSR. The common source plugs CSP may be coupled to corresponding (e.g., respective) common source regions CSR. Each of the common source plugs CSP may extend along the X direction. The common source plugs CSP may include a conductive material (e.g., metal).

Insulating spacers SP may be provided between the common source plug CSP and its adjacent stack structures STS. The insulating spacers SP may include an insulating material. For example, the insulating spacers SP may include silicon oxide, silicon nitride, or silicon oxynitride.

A first interlayer dielectric layer 130 may be provided on (e.g., to cover) the stack structures STS. On the connection region CNR, the first interlayer dielectric layer 130 may be on (e.g., may cover) the stepwise structure STW. In some embodiments, as illustrated in FIGS. 2A to 2C, the first interlayer dielectric layer 130 may extend onto the cell array region CAR to thereby cover the stack structures STS. In some embodiments, differently from that illustrated in FIGS. 2A to 2C, the first interlayer dielectric layer 130 may be provided only on the connection region CNR. The first interlayer dielectric layer 130 may include an insulating material. For example, the first interlayer dielectric layer 130 may include silicon oxide.

The support structures SS may be provided on the connection region CNR. Each of the support structures SS may sequentially penetrate the first interlayer dielectric layer 130, the stepwise structure STW of the stack structure STS, and the buffer pattern 102.

Referring to FIGS. 2A and 3A, each of the support structures SS may include a dummy lower semiconductor pattern DLS, a dummy upper semiconductor pattern DUS, a dummy buried insulating pattern DVI, a dummy vertical insulating pattern DVP, and a dummy conductive pad DCP. Accordingly, the support structures SS may be referred to herein as "dummy structures," respectively, because each support structure SS may be electrically isolated from any memory cell(s) of the semiconductor device.

The dummy lower semiconductor pattern DLS may be provided on a lower portion of the support structure SS and in contact with the substrate 100. The dummy lower semiconductor pattern DLS may have a pillar shape extending in a Z direction (designated by symbol Z of FIG. 1) perpendicular to the top surface of the substrate 100. The dummy lower semiconductor pattern DLS may fill a recess region 100r formed on the top surface of the substrate 100, and may penetrate a bottommost conductive pattern 110. The dummy lower semiconductor pattern DLS may have a top surface at a level that is higher than that of a bottom surface of the bottommost insulating pattern 120 and lower than that of a top surface of the bottommost insulating pattern 120. The dummy lower semiconductor pattern DLS may include silicon selectively epitaxially grown from the substrate 100 serving as a seed. The dummy lower semiconductor pattern DLS may have the same conductive type as that of the substrate 100.

A dummy gate insulating layer DGI may be provided between the dummy lower semiconductor pattern DLS and the bottommost conductive pattern 110. The dummy gate insulating layer DGI may include, for example, silicon oxide.

The dummy upper semiconductor pattern DUS may be disposed on the dummy lower semiconductor pattern DLS.

The dummy upper semiconductor pattern DUS may extend in the Z direction. The dummy upper semiconductor pattern DUS may have a lower portion connected to the dummy lower semiconductor pattern DLS and may have an upper portion connected to the dummy conductive pad DCP.

The dummy upper semiconductor pattern DUS may have a hollow pipe shape or a macaroni shape. The dummy upper semiconductor pattern DUS may have a closed bottom end. The dummy upper semiconductor pattern DUS may have an inside filled with the dummy buried insulating pattern DVI. The dummy upper semiconductor pattern DUS may have a bottom surface lower than a topmost surface of the dummy lower semiconductor pattern DLS.

The dummy upper semiconductor pattern DUS may include a first dummy semiconductor pattern DSP1 and a second dummy semiconductor pattern DSP2. The first dummy semiconductor pattern DSP1 may have a macaroni or pipe shape whose bottom end is closed. The first dummy semiconductor pattern DSP1 may have an inside filled with the dummy buried insulating pattern DVI. A portion of the first dummy semiconductor pattern DSP1 may be inserted into and coupled to the dummy lower semiconductor pattern DLS. The second dummy semiconductor pattern DSP2 may be placed on an outer wall of the first dummy semiconductor pattern DSP1. The first dummy semiconductor pattern DSP1 may connect the second dummy semiconductor pattern DSP2 and the dummy lower semiconductor pattern DLS to each other. The second dummy semiconductor pattern DSP2 may have a macaroni or pipe shape whose top and bottom ends are opened. The second dummy semiconductor pattern DSP2 may be spaced apart from the dummy lower semiconductor pattern DLS.

The dummy upper semiconductor pattern DUS may have the same conductive type as that of the substrate 100 or may be in an undoped state. The dummy upper semiconductor pattern DUS may include, for example, silicon, germanium, or a mixture thereof.

The dummy conductive pad DCP may be disposed on the dummy upper semiconductor pattern DUS. The dummy upper semiconductor pattern DUS may thus be disposed between the dummy lower semiconductor pattern DLS and the dummy conductive pad DCP. The dummy conductive pad DCP may include a metallic material or an impurity-doped semiconductor material.

The dummy vertical insulating pattern DVP may be disposed between the dummy upper semiconductor pattern DUS and the conductive patterns 110. The dummy vertical insulating pattern DVP may include a blocking insulating layer adjacent to the conductive patterns 110, a tunnel insulating layer adjacent to an upper semiconductor pattern US which will be discussed below herein, and a charge storage layer between the blocking insulating layer and the tunnel insulating layer. The tunnel insulating layer may include, for example, a silicon oxide layer. The charge storage layer may include, for example, a silicon nitride layer, a silicon oxynitride layer, a silicon-rich nitride layer, an insulating layer including conductive nano-dots, or a laminated trap layer. The blocking insulating layer may include, for example, a silicon oxide layer, a silicon nitride layer, and/or a silicon oxynitride layer.

Horizontal insulating patterns HP may be provided between the support structures SS and the conductive patterns 110. Each of the horizontal insulating patterns HP may extend onto top and bottom surfaces of its adjacent conductive pattern 110. Each of the horizontal insulating patterns HP may also extend between the conductive pattern 110 and the vertical structure VS which will be discussed below. The horizontal insulating pattern HP may include, for example, silicon oxide, silicon nitride, metal oxide, or metal nitride.

A plurality of the support structures SS may penetrate one pad 110p. In some embodiments, as illustrated in FIG. 1, four support structures SS may penetrate the pad 110p of one conductive pattern 110. The present inventive concepts, however, are not limited thereto.

Each of the support structures SS may have a horizontal section whose shape can be changed depending on a level (e.g., a height from the top surface of the substrate 100). In this description, the phrase "horizontal section" may refer to a cross section including a plane substantially parallel to the top surface of the substrate 100.

Figure 3C:
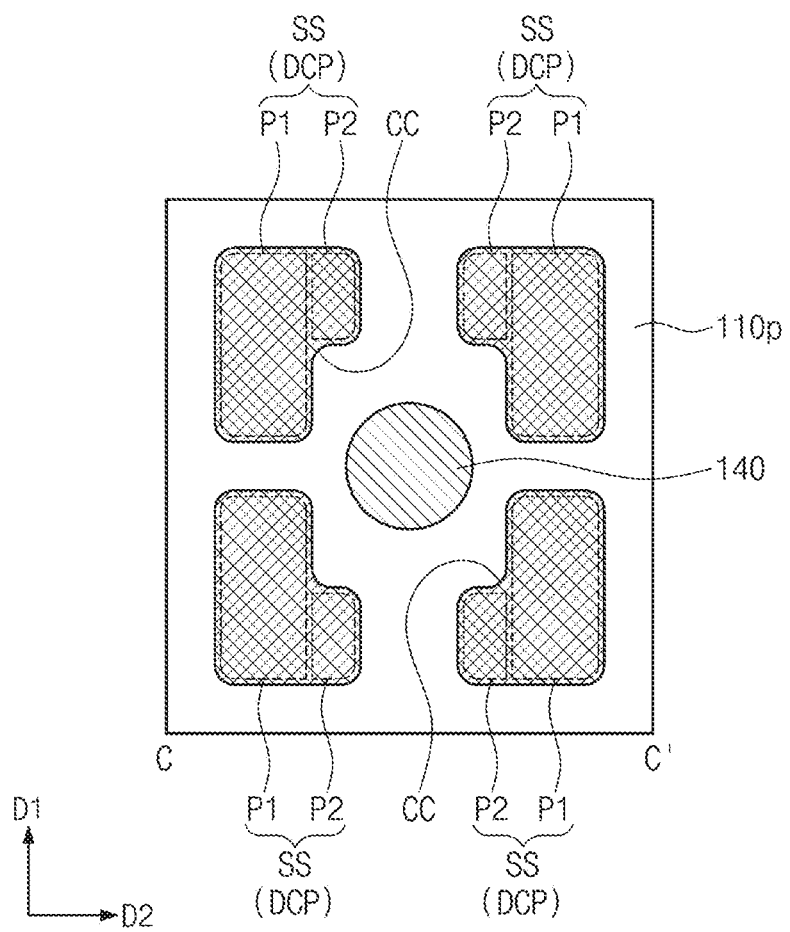
FIGS. 3C, 3D, and 3E illustrate horizontal sectional views respectively taken along lines C-C', D-D', and E-E' of FIG. 2A.
Figure 3D:
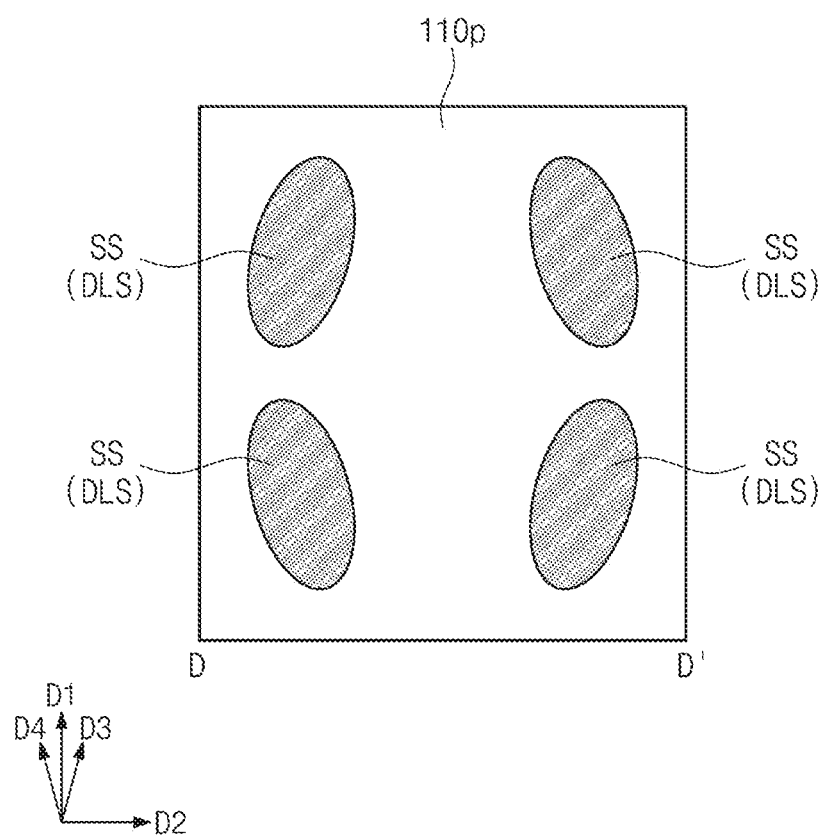
Figure 3E:
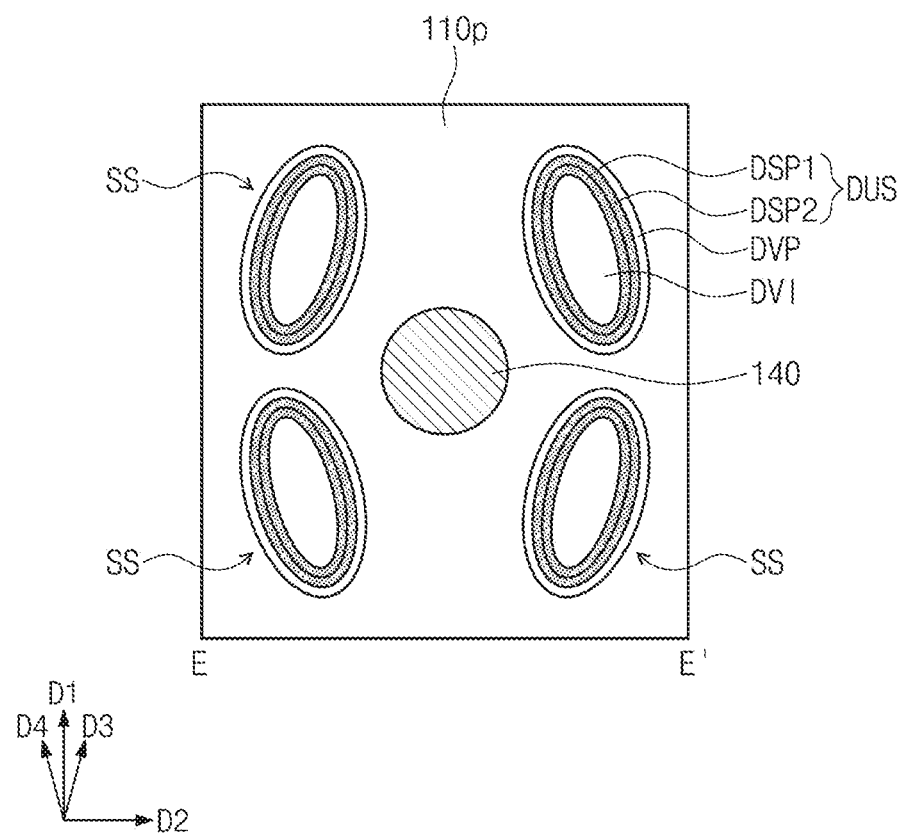

Although no pad 110p may otherwise appear in the horizontal sectional views of FIGS. 3C to 3E along the lines C-C', D-D', and E-E', for convenience of description, FIGS. 3C to 3E show a vertical projection view of the pad 110p thereunder or thereabove.

Referring further to FIG. 3C, when viewed in horizontal section, an upper portion (or the dummy conductive pad DCP) of each support structure SS may include a first segment P1 extending in a first direction D1 and a second segment P2 protruding from the first segment P1 in a second direction D2 crossing the first direction D1. The second segment P2 may protrude from an end portion of the first segment P1. Accordingly, the upper portion (or the dummy conductive pad DCP) of each support structure SS may have an L (or other non-circular, non-elliptical) shape. In some embodiments, the first direction D1 may be substantially the same as the Y direction, and the second direction D2 may be substantially the same as the X direction. The present inventive concepts, however, are not limited thereto.

The support structures SS penetrating the same pad 110p may be configured such that the second segments P2 of a pair of neighboring support structures SS in the first direction D1 may protrude from opposing end portions, each of which is included in its corresponding (e.g., respective) first segment P1. For example, in a pair of the support structures SS that lie adjacent to each other in the first direction D1 and penetrate the same pad 110p, the second segment P2 of the support structure SS at an upside (e.g., upper, in the first direction D1) position may protrude from an upside end portion of the first segment P1, and the second segment P2 of the support structure SS at a downside position may protrude from a downside (e.g., lower) end portion of the first segment P1.

The support structures SS penetrating the same pad 110p may be configured such that the second segments P2 of a pair of neighboring structure structures SS in the second direction D2 may protrude to face each other.

When viewed in horizontal section, the upper portion (or the dummy conductive pad DCP) of each support structure SS may include a concave (or otherwise curved) segment CC defined at a location where the first segment P1 and the second segment P2 are connected to each other. The concave segment CC of each support structure SS may be positioned to face a center of the pad 110p through which each of the support structures SS penetrates.

Referring further to FIG. 3D, when viewed in horizontal section (e.g., a plane parallel to the plane illustrated in FIG. 3C), a lower portion (or the dummy lower semiconductor pattern DLS) of each support structure SS may have a shape extending in a third direction D3 or in a fourth direction D4, each of which crosses the first and second directions D1 and D2. For example, when viewed in horizontal section, the lower portion (or the dummy lower semiconductor pattern DLS) of each support structure SS may have an elliptical shape whose major (e.g., primary) axis extends in the third direction D3 or in the fourth direction D4, or a bar shape extending in the third direction D3 or in the fourth direction D4. Each of the third and fourth directions D3 and D4, which corresponds to the extending direction of the lower portion (or the dummy lower semiconductor pattern DLS) of each support structure SS, may not face the center of the pad 110p through which each of the support structures SS penetrates.

Referring further to FIG. 3E, when viewed in horizontal section, an intermediate portion of each support structure SS may have a similar shape to that of the lower portion (or the dummy lower semiconductor pattern DLS) of each support structure SS. As such, the intermediate portion of each support structure SS may have a shape extending in the third direction D3 or in the fourth direction D4. For example, when viewed in horizontal section, the intermediate portion of each support structure SS may have an elliptical shape whose major axis extends in the third direction D3 or in the fourth direction D4, or a bar shape extending in the third direction D3 or in the fourth direction D4. Each of the third and fourth directions D3 and D4, which correspond to the extending direction of the intermediate portion of each support structure SS, may not face the center of the pad 110p through which each of the support structures SS penetrates.

The vertical structures VS may be provided on the cell array region CAR. Each of the vertical structures VS may sequentially (e.g., in the Z direction) penetrate the first interlayer dielectric layer 130, the stack structure STS, and the buffer pattern 102.

Referring to FIGS. 2A and 3B, each of the vertical structures VS may include a lower semiconductor pattern LS, an upper semiconductor pattern US, a buried insulating pattern VI, a vertical insulating pattern VP, and a conductive pattern CP. The vertical structure VS may be substantially the same as the support structure SS, except for the horizontal sectional shape. For example, except for the horizontal sectional shape, the lower semiconductor pattern LS, the upper semiconductor pattern US, the buried insulating pattern VI, the vertical insulating pattern VP, and the conductive pad CP may be substantially the same respectively as the dummy lower semiconductor pattern DLS, the dummy upper semiconductor pattern DUS, the dummy buried insulating pattern DVI, the dummy vertical insulating pattern DVP, and the dummy conductive pad DCP. The upper semiconductor pattern US may include a first semiconductor pattern SP1 and a second semiconductor pattern SP2. The first semiconductor pattern SP1 and the second semiconductor pattern SP2 may be substantially the same respectively as the first dummy semiconductor pattern DSP1 and the second dummy semiconductor pattern DSP2.

Each of the vertical structures VS may have a circular horizontal section. At the same level (e.g., in the same plane), the horizontal section of each vertical structure VS may have a size (e.g., a surface area) less than (and/or a shape different from) that of the horizontal section of each support structure SS. For example, a horizontal plane (e.g., a horizontal cross section) that includes a dummy conductive pad DCP of a support structure SS and a conductive pad CP of a vertical structure VS may show that the dummy conductive pad DCP has a different shape from, and/or a larger size than, the conductive pad CP.

A second interlayer dielectric layer 132 may be provided on the first interlayer dielectric layer 130. The second interlayer dielectric layer 132 may overlap/cover the vertical structures VS and the support structures SS. The second interlayer dielectric layer 132 may include an insulating material. For example, the second interlayer dielectric layer 132 may include silicon oxide, silicon nitride, or silicon oxynitride.

Contact plugs 140 may be provided on the connection region CNR (e.g., as illustrated in FIGS. 1 and 2C). The contact plugs 140 may penetrate the first and second interlayer dielectric layers 130 and 132, and may be connected to corresponding (e.g., respective) pads 110p of the conductive patterns 110. Each of the contact plugs 140 may be coupled to a center of its corresponding (e.g., respective) pad 110p (e.g., as illustrated in FIGS. 3C and 3E). The contact plugs 140 may include a conductive material.

Referring to FIG. 3C, when viewed in horizontal section, the concave (e.g., inwardly curved) segment CC on the upper portion of each support structure SS may be positioned to face the contact plug 140 coupled to the pad 110p through which each of the support structures SS penetrates. Referring to FIG. 3E, when viewed in horizontal section, the intermediate portion of each support structure SS may not extend in a direction that faces the contact plug 140 coupled to the pad 110p through which each of the support structures SS penetrates.

Upper contacts 142 may be provided on the cell array region CAR (e.g., as illustrated in FIGS. 2A and 2C). The upper contacts 142 may penetrate the second interlayer dielectric layer 132, and may be coupled to corresponding (e.g., respective) vertical structures VS. The upper contacts 142 may include a conductive material.

First upper lines 150 and second upper lines 152 may be provided on the second interlayer dielectric layer 132. The first upper lines 150 may be provided on the connection region CNR to come into connection (e.g., electrical connection and/or physical contact) with the contact plugs 140 (e.g., as illustrated in FIGS. 2A and 2C). The second upper lines 152 may be provided on the cell array region CAR to come into connection (e.g., electrical connection and/or physical contact) with the upper contacts 142 (e.g., as illustrated in FIGS. 1, 2A, and 2C). The first and second upper lines 150 and 152 may include a conductive material.

Figure 8A:
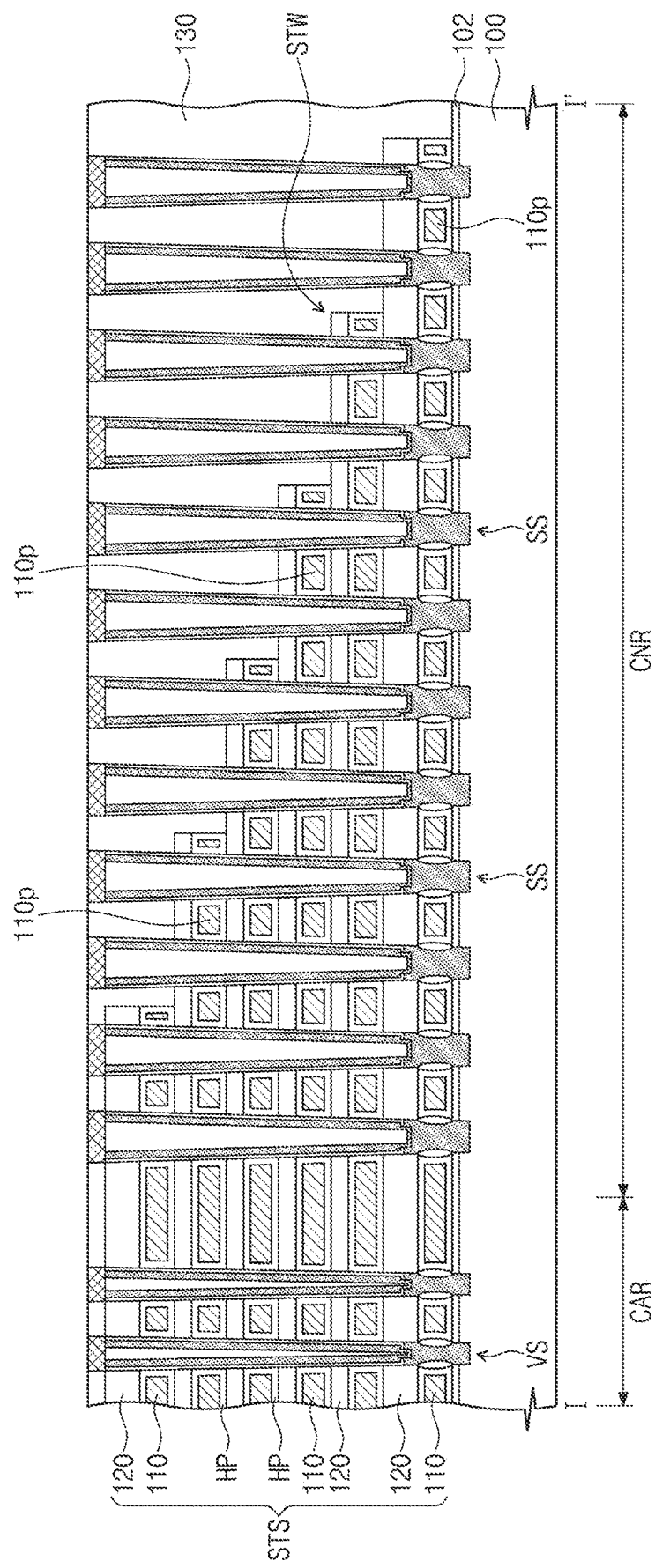
Figure 8B:
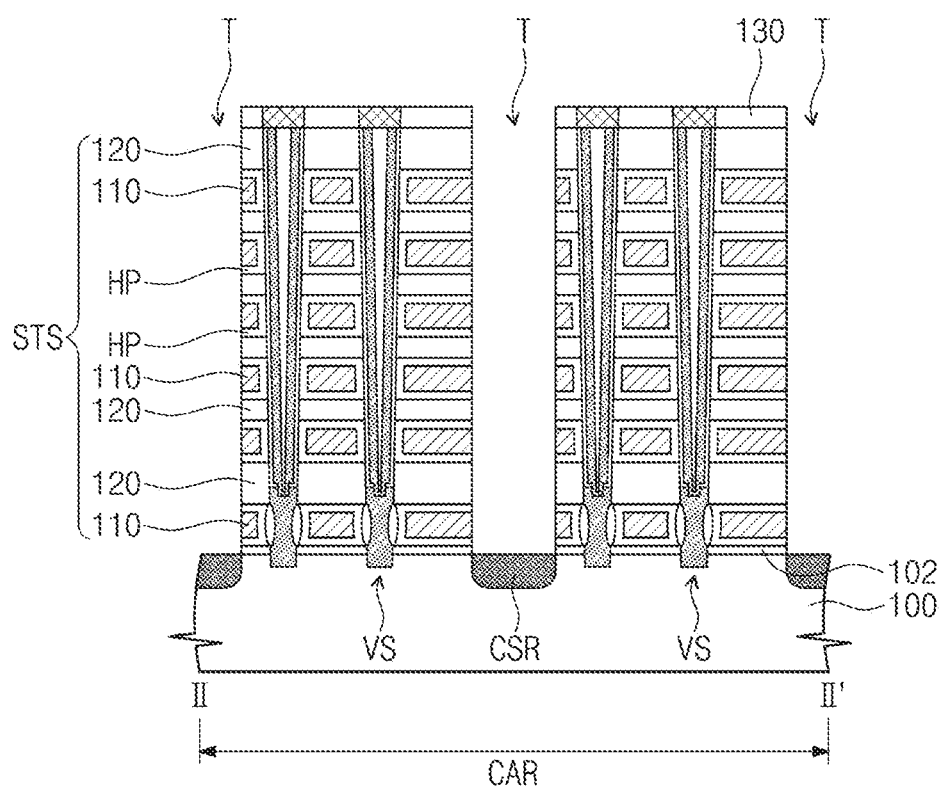
Figure 8C:
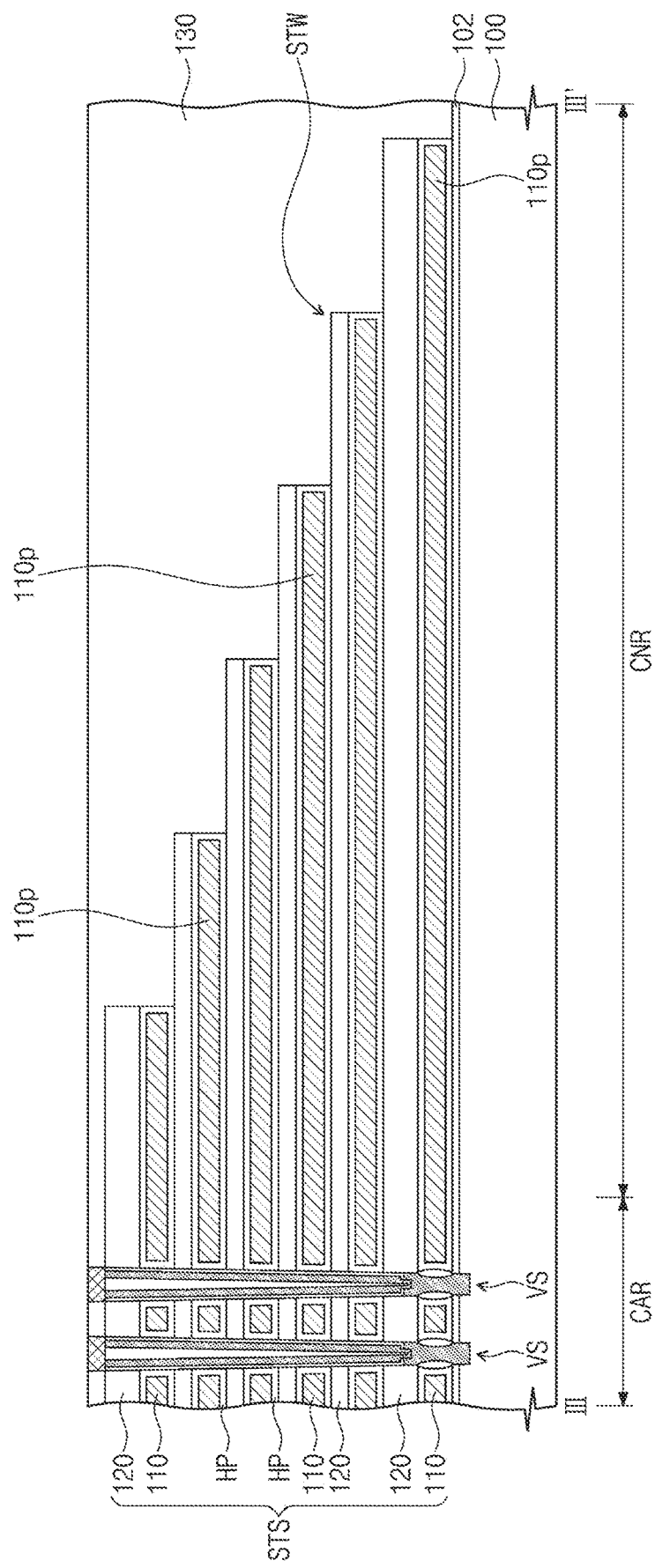
FIGS. 8C and 9C illustrate vertical sectional views showing a method of fabricating a semiconductor device according to example embodiments of the present inventive concepts.
Figure 9A:
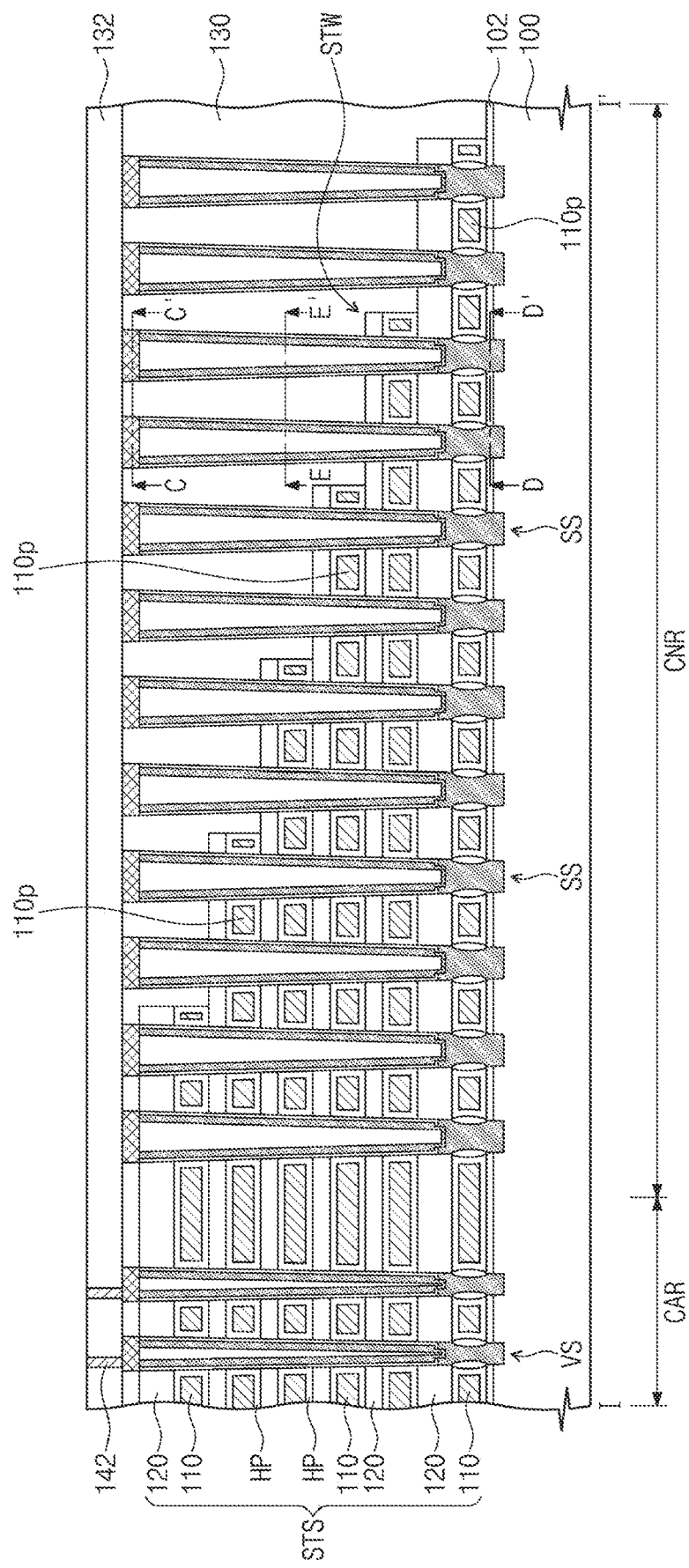
Figure 9B:
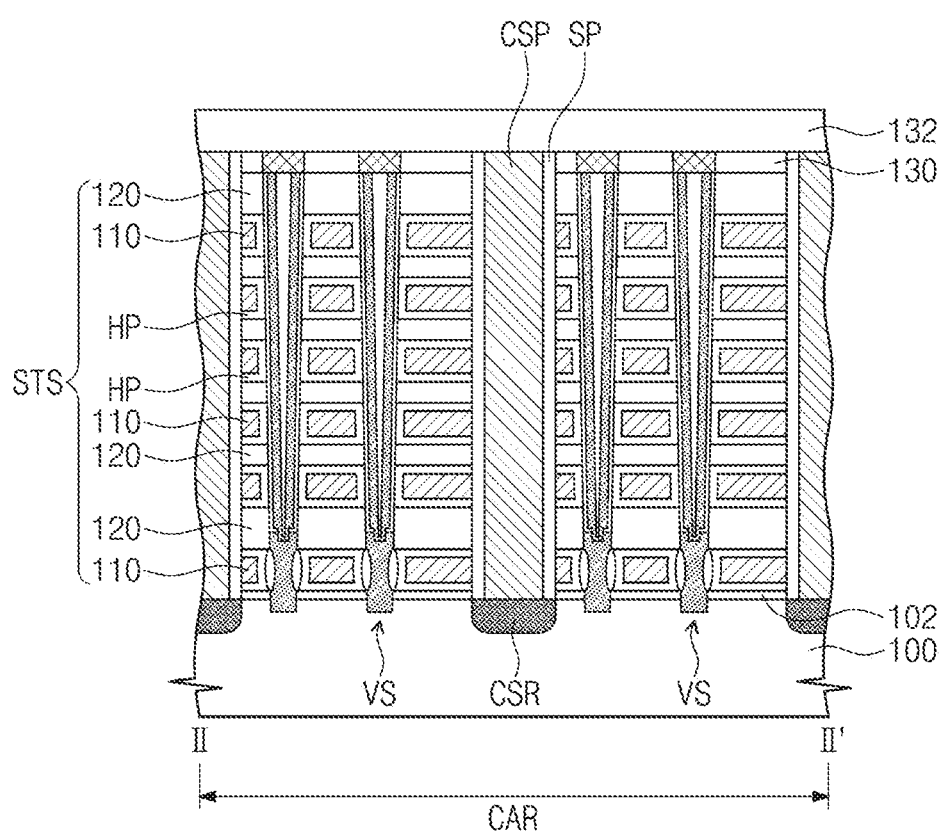
Figure 9C:
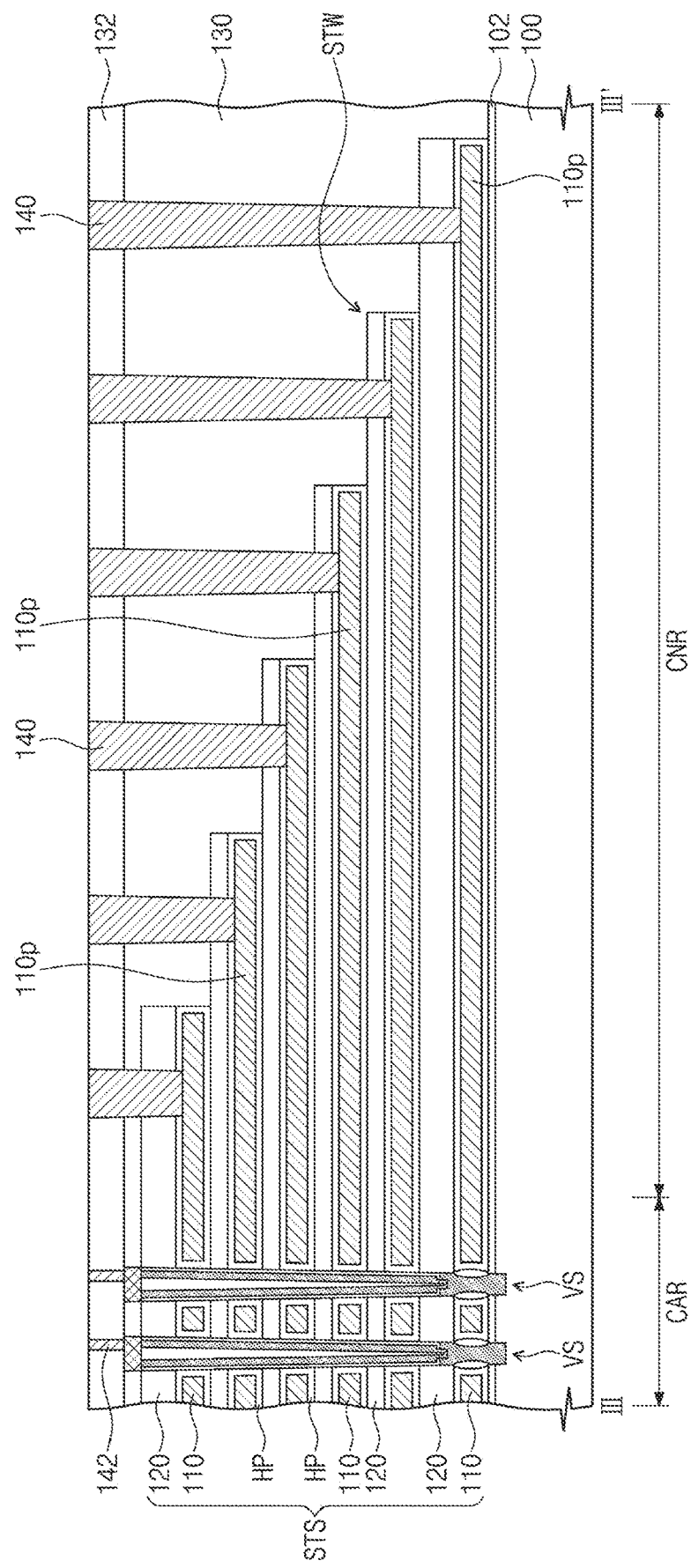

FIGS. 4A, 5A, 6A, 7A, 8A, and 9A illustrate vertical sectional views showing a method of fabricating a semiconductor device according to example embodiments of the present inventive concepts. For example, FIGS. 4A, 5A, 6A, 7A, 8A, and 9A may be vertical sectional views taken along line I-I' of FIG. 1. FIGS. 4B, 5B, 6B, 7B, 8B, and 9B illustrate vertical sectional views showing a method of fabricating a semiconductor device according to example embodiments of the present inventive concepts. For example, FIGS. 4B, 5B, 6B, 7B, 8B, and 9B may be vertical sectional views taken along line II-II' of FIG. 1. FIGS. 5C, 5D, and 5E illustrate horizontal sectional views respectively taken along lines C-C', D-D', and E-E' of FIG. 5A. FIGS. 8C and 9C illustrate vertical sectional views showing a method of fabricating a semiconductor device according to example embodiments of the present inventive concepts. For example, FIGS. 8C and 9C may be vertical sectional views taken along line III-III' of FIG. 1. FIGS. 3C, 3D, and 3E illustrate horizontal sectional views respectively taken along lines C-C', D-D', and E-E' of FIG. 9A (and of FIG. 2A).

In FIGS. 4A-9C and descriptions thereof herein, components/elements substantially the same as those discussed with reference to FIGS. 1, 2A to 2C, and 3A to 3E may be allocated the same reference numerals thereto, and a repetitive/repeated explanation thereof may be omitted for brevity of the description.

Figure 4B:
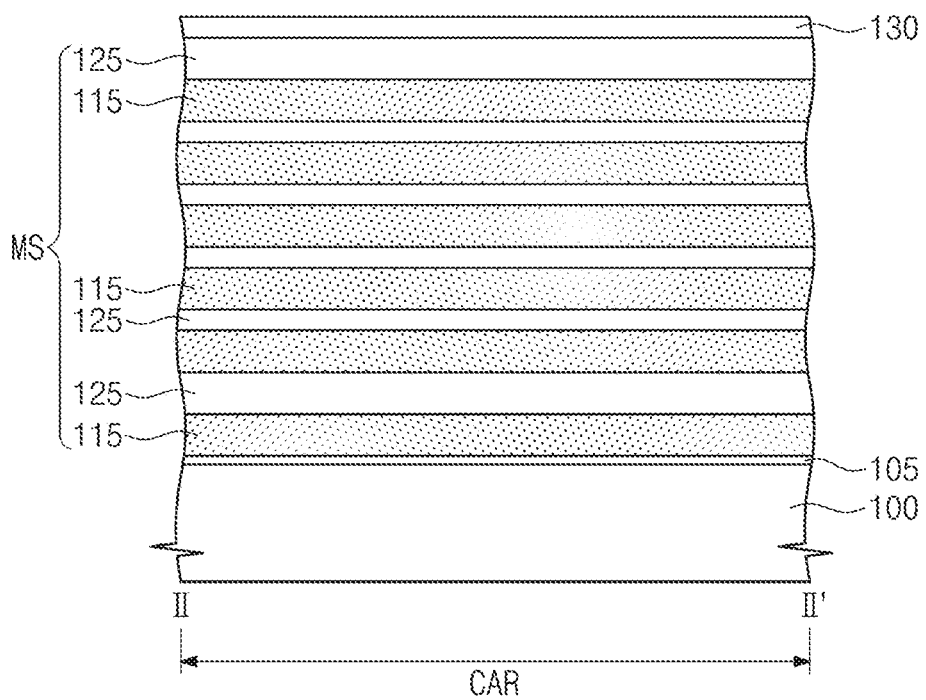
FIGS. 4B, 5B, 6B, 7B, 8B, and 9B illustrate vertical sectional views showing a method of fabricating a semiconductor device according to example embodiments of the present inventive concepts.

Referring to FIGS. 1, 4A, and 4B, a substrate 100 may be provided to include a cell array region CAR and a connection region CNR. The cell array region CAR and the connection region CNR may be adjacent to each other. The substrate 100 may be a semiconductor substrate. For example, the substrate 100 may be a silicon wafer having a first conductive type (e.g., a p-type conductivity).

A buffer layer 105 may be formed on the substrate 100. The buffer layer 105 may be on (e.g., may cover) the cell array region CAR and the connection region CNR. The buffer layer 105 may include an insulating material. For example, the buffer layer 105 may include silicon oxide.

A mold structure MS may be formed on the buffer layer 105. The mold structure MS may include sacrificial layers 115 and insulating layers 125 that are alternately and repeatedly stacked. A bottommost insulating layer 125 and a topmost insulating layer 125 may have thicknesses greater than those of intervening insulating layers 125 between the bottommost and topmost insulating layers 125. The insulating layers 125 may include, for example, silicon oxide. The sacrificial layers 115 may include a material having an etch selectivity to the buffer layer 105 and the insulating layers 125. For example, the sacrificial layers 115 may include silicon nitride.

The mold structure MS may be formed to extend onto the connection region CNR from the cell array region CAR. The mold structure MS may have a stepwise (e.g., stepped) structure STW on the connection region CNR. For example, the stepwise structure STW of the mold structure MS may descend away from the cell array region CAR. Accordingly, each of the sacrificial layers 115 except for a topmost sacrificial layer 115 may have a preliminary pad 115p exposed by an overlying sacrificial layer 115. The topmost sacrificial layer 115 may have a preliminary pad 115p at its end portion on the connection region CNR.

A first interlayer dielectric layer 130 may be formed on (e.g., to cover) the mold structure MS. On the connection region CNR, the first interlayer dielectric layer 130 may be on (e.g., may cover) the stepwise structure STW of the mold structure MS. The first interlayer dielectric layer 130 may include an insulating material having an etch selectivity to the sacrificial layers 115. For example, the first interlayer dielectric layer 130 may include silicon oxide.

Figure 5A:
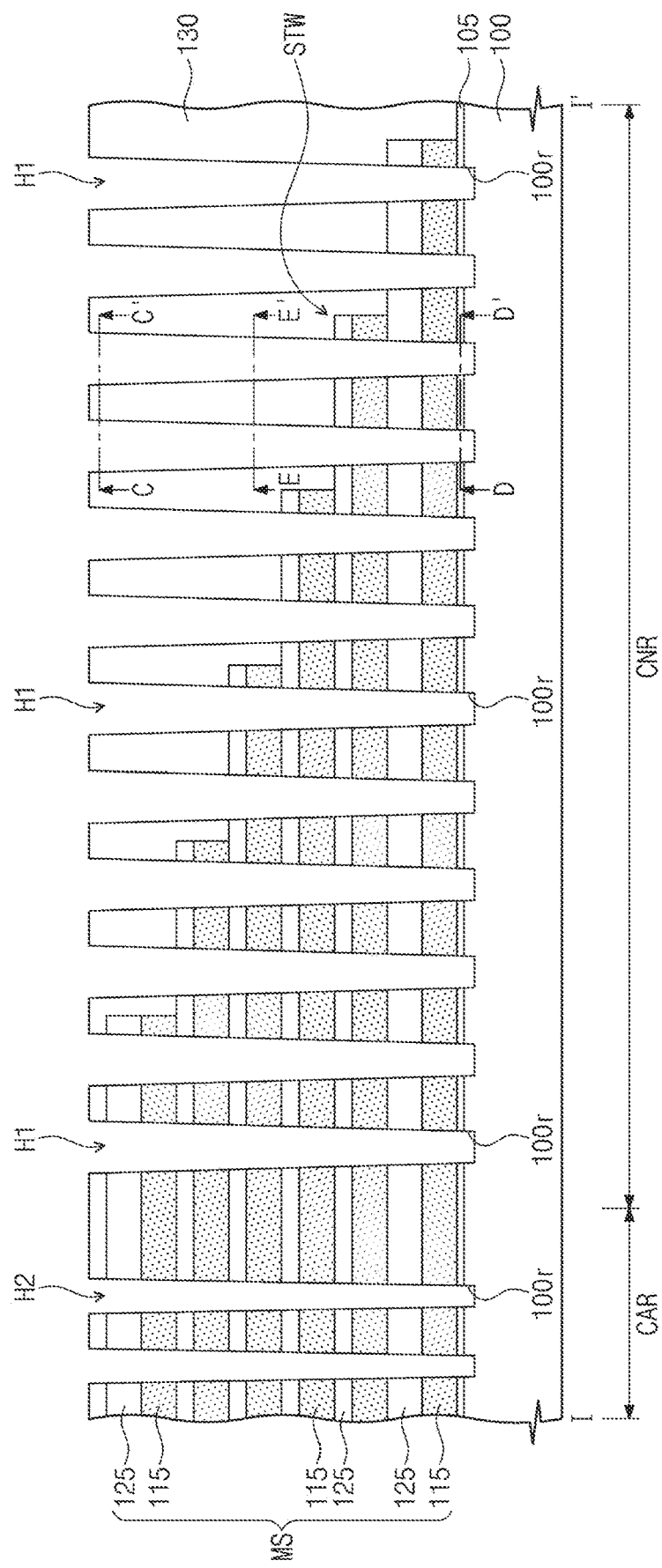
Figure 5B:
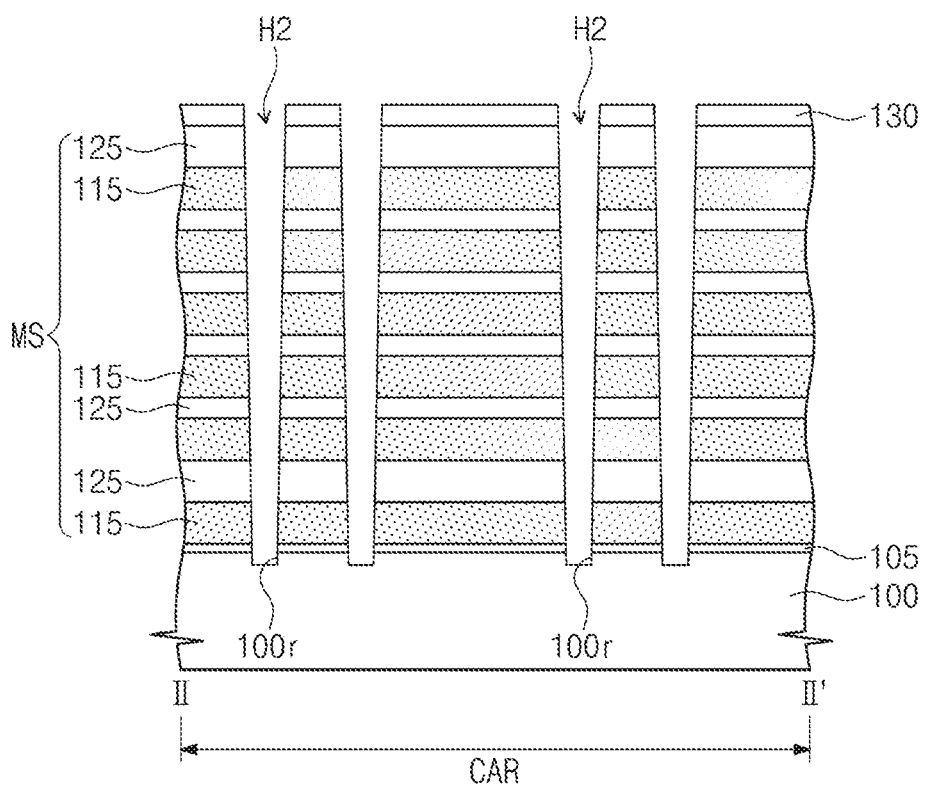
Figure 5C:
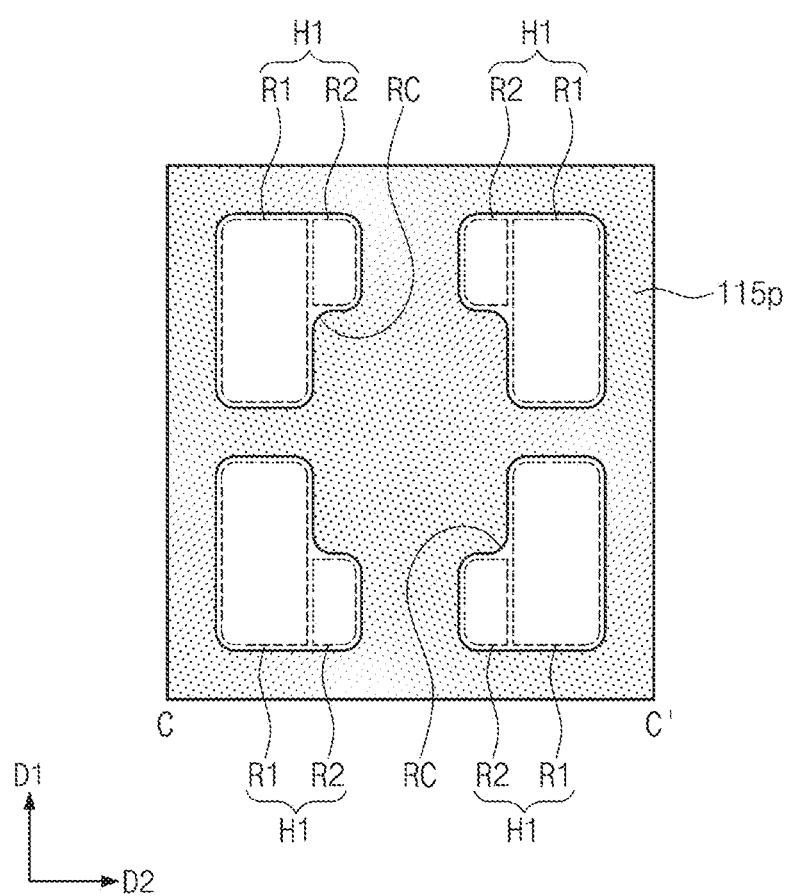
FIGS. 5C, 5D, and 5E illustrate horizontal sectional views respectively taken along lines C-C', D-D', and E-E' of FIG. 5A.
Figure 5D:
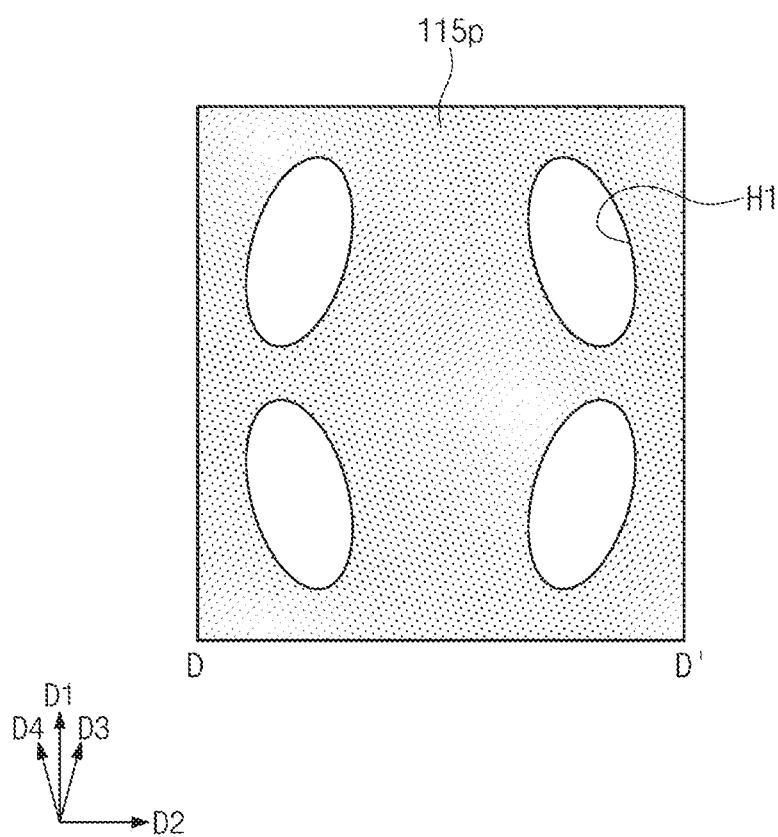
Figure 5E:
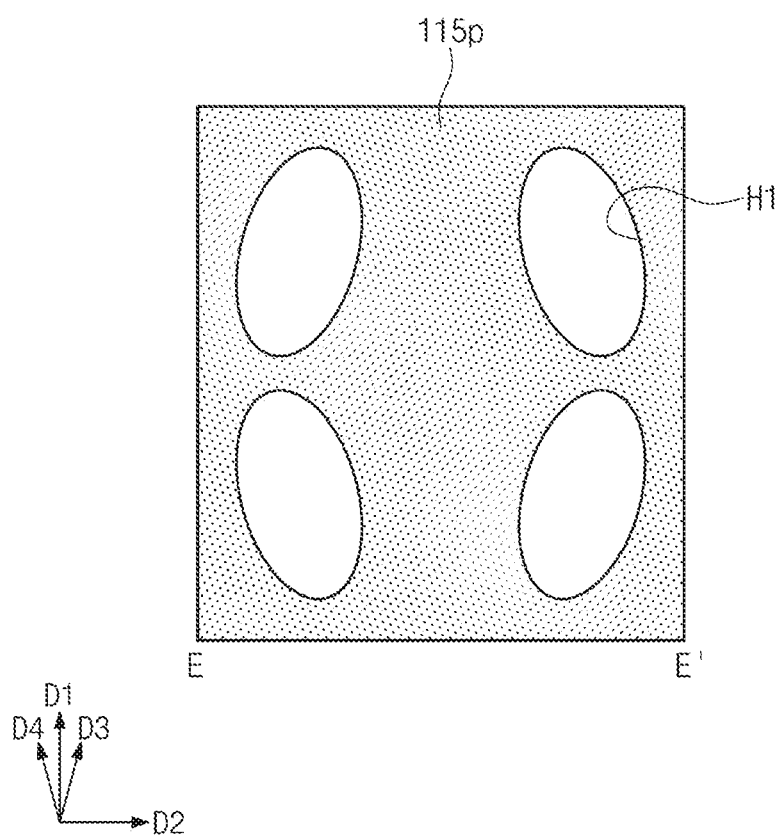

Referring to FIGS. 1, 5A, and 5B, first holes H1 may be formed on the connection region CNR, and second holes H2 may be formed on the cell array region CAR. The first holes H1 and the second holes H2 may be formed simultaneously with each other. The first holes H1 may penetrate the first interlayer dielectric layer 130, the stepwise structure STW of the mold structure MS, and the buffer layer 105, thereby exposing a top surface of the substrate 100. The second holes H2 may penetrate the first interlayer dielectric layer 130, the mold structure MS, and the buffer layer 105, thereby exposing the top surface of the substrate 100. When the first and second holes H1 and H2 are formed, the top surface of the substrate 100 may be etched to form recess regions 100r.

A plurality of the first holes H1 may be formed to penetrate one preliminary pad 115p. In some embodiments, as illustrated in FIG. 5C, four first holes H1 may be formed to penetrate one preliminary pad 115p. The present inventive concepts, however, are not limited thereto.

Each of the first holes H1 may have a horizontal section whose shape can vary depending on a level (e.g., a height from the top surface of the substrate 100).

Although a preliminary pad 115p generally may not otherwise appear in the horizontal sectional views of FIGS. 5C to 5E, for convenience of description, FIGS. 5C to 5E show a vertical projection view of the preliminary pad 115p.

Referring further to FIG. 5C, when viewed in horizontal section, an upper portion of each first hole H1 may include a first segment R1 extending in a first direction D1 and a second segment R2 protruding from the first segment R1 in a second direction D2 crossing the first direction D1. The second segment R2 may protrude from an end portion of the first segment R1. Accordingly, the upper portion of each first hole H1 may have an L shape.

The first holes H1 penetrating the same preliminary pad 115p may be formed such that the second segments R2 of a pair of neighboring first holes H1 in the first direction D1 may protrude from opposing end portions, each of which is included in its corresponding (e.g., respective) first hole H1. For example, in a pair of the first holes R1 that lie adjacent to each other in the first direction D1 and penetrate the same preliminary pad 115p, the second segment R2 of the first hole H1 at an upside (e.g., upper) position may protrude from an upside end portion of the first segment R1, and the second segment R2 of the first hole H1 at a downside (e.g., lower) position may protrude from a downside end portion of the first segment R1.

The first holes H1 penetrating the same preliminary pad 115p may be formed such that the second segments R2 of a pair of neighboring first holes H1 in the second direction D2 may protrude to face each other.

When viewed in horizontal section, the upper portion of each first hole H1 may include a concave segment RC defined at a location where the first segment R1 and the second segment R2 are connected to each other. When viewed in horizontal section, the concave segment RC on the upper portion of each first hole H1 may be positioned to face a center of the preliminary pad 115p through which each of the first holes H1 penetrates.

Referring further to FIGS. 5D and 5E, when viewed in horizontal section, lower and intermediate (e.g., middle) portions of each first hole H1 may have a shape extending in a third direction D3 or in a fourth direction D4, each of which crosses the first and second directions D1 and D2. For example, when viewed in horizontal section, the lower and intermediate portions of each first hole H1 may have an elliptical shape whose major axis extends in the third direction D3 or in the fourth direction D4, or a bar shape extending in the third direction D3 or in the fourth direction D4. Each of the third and fourth directions D3 and D4, which corresponds to the extending direction of the lower and intermediate portions of each first hole H1, may not face the center of the preliminary pad 115p through which each of the first holes H1 penetrates. This may be caused by the fact that the concave segment RC on the upper portion of each first hole H1 is positioned to face the center of the preliminary pad 115p through which each of the first holes H1 penetrates. Namely, the horizontal sectional shape of each first hole H1 may affect horizontal sectional shapes of the lower and intermediate portions of each of the first holes H1.

Each of the second holes H2 may have a circular horizontal section. At the same level (e.g., in the same horizontal plane), the horizontal section of each second hole H2 may have a size smaller than that of the horizontal section of each first hole H1.

The number of the first holes H1 per unit area may be less than the number of the second holes H2 per unit area. In this sense, when the first and second holes H1 and H2 are formed at the same time, the first holes H1 may be less likely to be completely formed even after the second holes H2 are fully formed. As a result, when using conventional techniques/ shapes, one or more of the first holes H1 may not be formed to have a sufficient depth to expose the top surface of the substrate 100.

According to example embodiments of the present inventive concepts, however, when viewed in horizontal section, the first holes H1 may have areas greater than those of the second holes H2. The first holes H1 may thus be inhibited/prevented from being formed to have an insufficient depth.

When the first hole H1 is formed using conventional techniques/shapes, the horizontal sectional shape of the first hole H1 may suffer from distortion problems caused by an increase in depth of the first hole H1. Accordingly, when viewed in horizontal section, the lower and intermediate portions of the first hole H1 may have a different shape from that of the upper portion of the first hole H1. When the upper portion of the first hole H1 has a circular horizontal section, it may be difficult to control distortion of the horizontal sectional shape on the lower and intermediate portions of the first hole H1.

According to example embodiments of the present inventive concepts, however, when viewed in horizontal section, the upper portion of the first hole H1 may have the concave segment RC that faces the center of the preliminary pad 115$p$ through which the first hole H1 penetrates. Thus, when viewed in horizontal section, the lower and intermediate portions of the first hole H1 may have a shape extending in the third direction D3 or in the fourth direction D4, each of which does not face the center of the preliminary pad 115$p$ through which the first hole H1 penetrates. In conclusion, it may be possible to control distortion of the horizontal sectional shape on the lower and intermediate portions of the first hole H1.

Figure 6A:
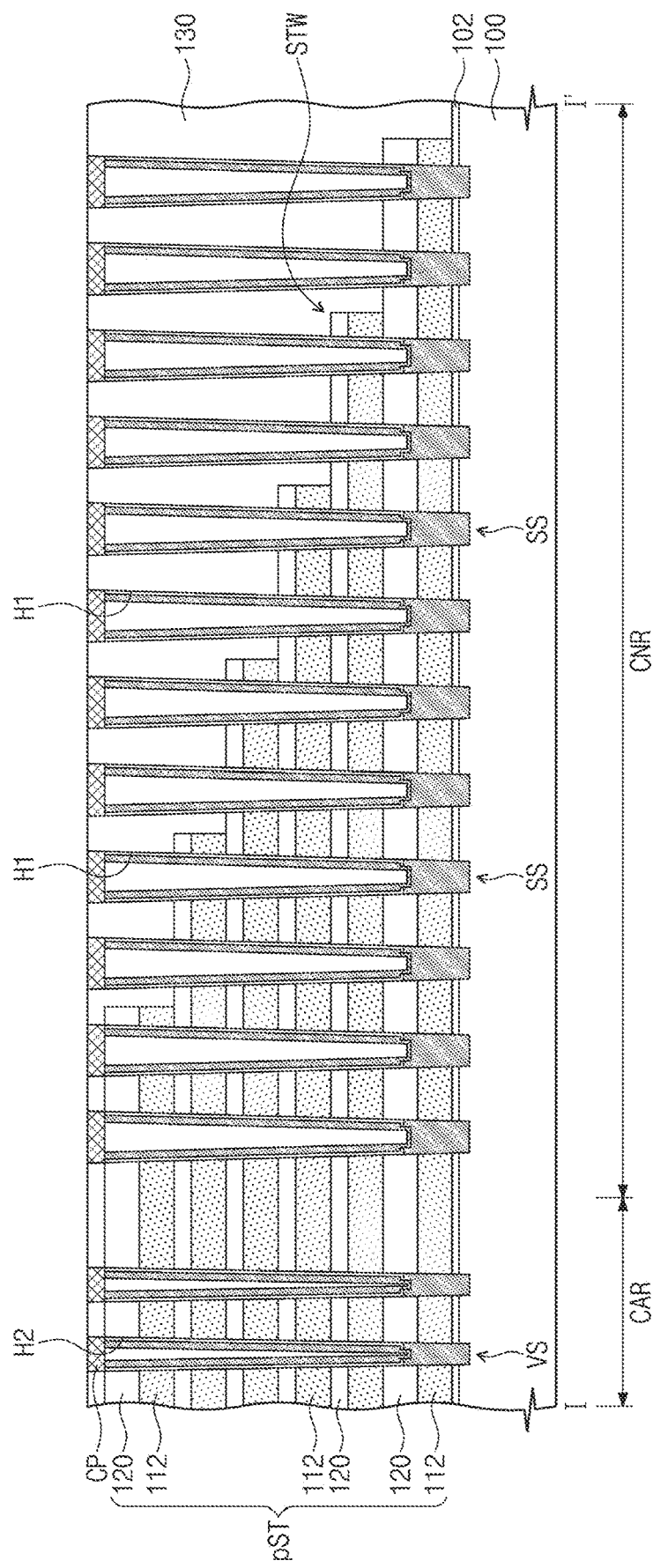
Figure 6B:
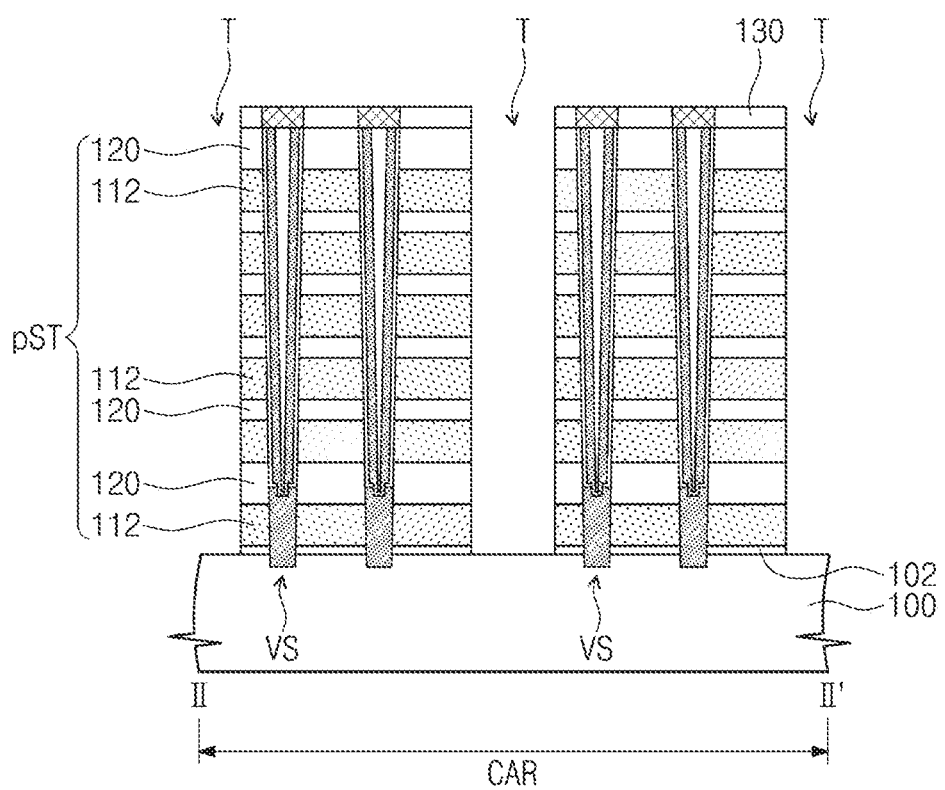

Referring to FIGS. 1, 6A, and 6B, support structures SS may be formed in corresponding (e.g., respective) first holes H1, and vertical structures VS may be formed in corresponding (e.g., respective) second holes H2. The support structures SS and the vertical structures VS may be substantially the same as those discussed with reference to FIGS. 1, 2A to 2C, and 3A to 3E.

The first interlayer dielectric layer 130, the mold structure MS, and the buffer layer 105 may be sequentially patterned to form trenches T exposing the top surface of the substrate 100. Each of the trenches T may extend in an X direction (designated by symbol X of FIG. 1). Hence, preliminary stack structures pST may be formed to extend in the X direction, while being spaced apart from each other in a Y direction (designated by symbol Y of FIG. 1) crossing the X direction. Each of the preliminary stack structures pST may include sacrificial patterns 112 formed from the sacrificial layers 115 and insulating patterns 120 formed from the insulating layers 125. In addition, a buffer pattern 102 may be formed from the buffer layer 105.

Figure 7A:
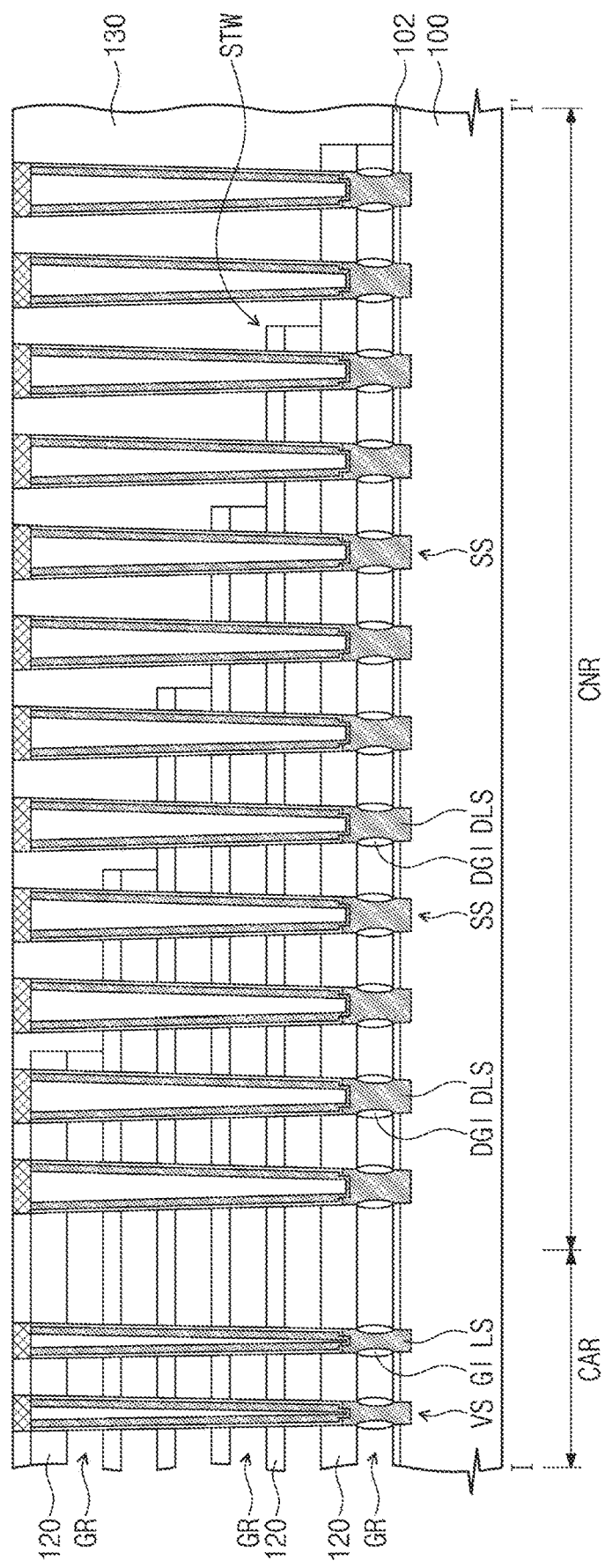
Figure 7B:
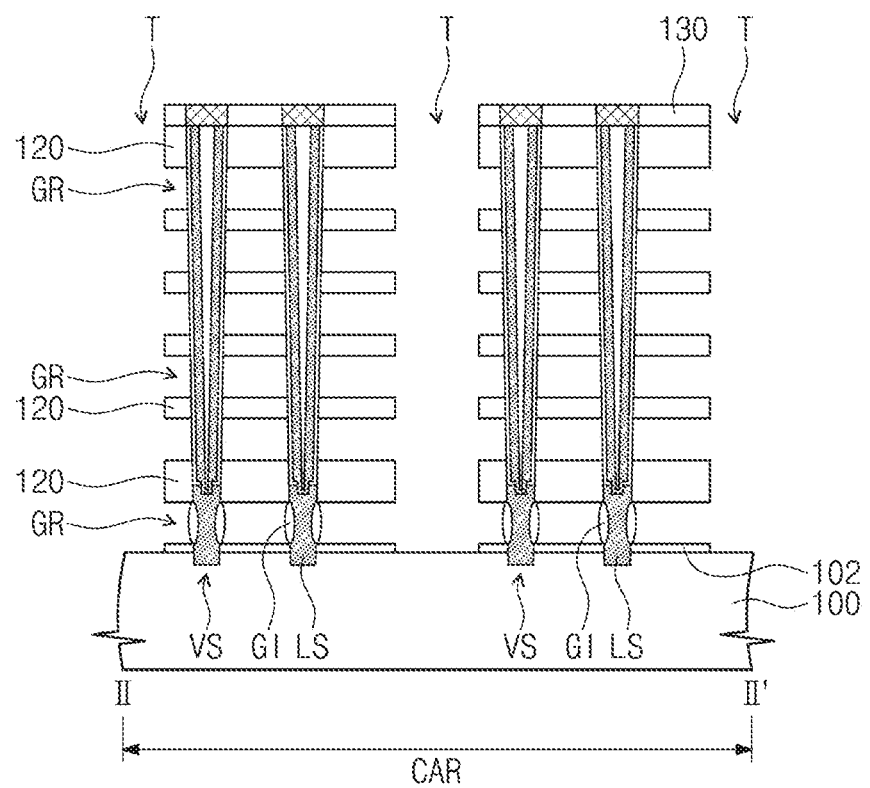

Referring to FIGS. 1, 7A, and 7B, the sacrificial patterns 112 may be removed. Gap regions GR may be defined to refer to zones where the sacrificial patterns 112 are removed. The gap regions GR may expose sidewalls of the support structures SS and sidewalls of the vertical structures VS. The removal of the sacrificial patterns 112 may be achieved by performing a wet etching process exhibiting an etch selectivity to the substrate 100, the buffer pattern 102, the insulating patterns 120, and the first interlayer dielectric layer 130.

Dummy gate insulating layers DGI may be formed on sidewalls of each dummy lower semiconductor pattern DLS that are exposed to the gap regions GR. In addition, gate insulating layers GI may be formed on sidewalls of each lower semiconductor pattern LS that are exposed to the gap regions GR. The dummy gate insulating layers DGI and the gate insulating layers GI may be formed using, for example, a thermal oxidation process.

Referring to FIGS. 1 and 8A to 8C, horizontal insulating patterns HP may be formed to conformally cover inner walls of the gap regions GR. In addition, conductive patterns 110 may be formed in the gap regions GR. The formation of the horizontal insulating patterns HP and the conductive patterns 110 may include forming an insulating layer to conformally cover the inner walls of the gap regions GR, forming a conductive layer to fill the gap regions GR, and removing portions of the insulating and conductive layers formed outside the gap regions GR.

The formation of the conductive patterns 110 may define stack structures STS, each including the conductive patterns 110 and the insulating patterns 120 that are alternately and repeatedly stacked. Each of the stack structures STS may be configured to have a stepwise structure STW on the connection region CNR. For example, the stepwise structure STW of each stack structure STS may descend away from the cell array region CAR. In such a configuration, each of the conductive patterns 110 except for a topmost conductive pattern 110 may have a pad 110$p$ exposed by an overlying conductive pattern 110. The topmost conductive pattern 110 may have a pad 110$p$ at its end portion that constitutes the stepwise structure STW on the connection region CNR.

Common source regions CSR may be formed in portions of the substrate 100 exposed to the trenches T. The formation of the common source regions CSR may include doping portions of the substrate 100 exposed to the trenches T with an impurity having a second conductive type (e.g., an n-type conductivity) different from the first conductive type.

Referring to FIGS. 1 and 9A to 9C, insulating spacers SP and a common source plug CSP may be formed in each of the trenches T. The formation of the insulating spacers SP may include forming an insulating spacer layer to conformally cover the trenches T and performing an anisotropic etching process on the insulating spacer layer. The anisotropic etching process may expose the common source regions CSR. Thereafter, the common source plug CSP may be formed in each of the trenches T. The formation of the common source plug CSP may include forming a conductive layer to fill the trenches T and planarizing the conductive layer.

A second interlayer dielectric layer 132 may be formed on (e.g., to cover) the first interlayer dielectric layer 130. The second interlayer dielectric layer 132 may be formed on (e.g., to cover) the vertical structures VS and the support structures SS. The second interlayer dielectric layer 132 may include an insulating material.

On the connection region CNR, contact plugs 140 may be formed to penetrate the first and second interlayer dielectric layers 130 and 132 to come into connection (e.g., electrical connection and/or physical contact) with corresponding (e.g., respective) pads 110$p$ of the conductive patterns 110.

Referring again to FIGS. 3C and 3E, each of the contact plugs 140 may be formed to come into connection with a center of the pad 110$p$. As discussed above, when viewed in horizontal section, lower and intermediate portions of the support structure SS (or the first hole H1) may have a shape extending in the third direction D3 or in the fourth direction D4, each of which does not face the center of the pad 110$p$ (or the preliminary pad 115$p$) through which the support structure SS penetrates. Accordingly, a sufficient spacing may be provided between the contact plugs 140 and the support structures SS, and therefore the contact plugs 140 and the support structures SS may be inhibited/prevented from being connected to each other.

On the cell array region CAR, upper contacts 142 may be formed to penetrate the second interlayer dielectric layer 132 to come into connection with corresponding (e.g., respective) vertical structures VS. The upper contacts 142 may include a conductive material.

Referring back to FIGS. 1, 2A, and 2C, first upper lines 150 and second upper lines 152 may be formed on the second interlayer dielectric layer 132. The first upper lines 150 may be provided on the connection region CNR to come into connection with the contact plugs 140, and the second upper lines 152 may be provided on the cell array region CAR to come into connection with the upper contacts 142.

According to example embodiments of the present inventive concepts, when viewed in horizontal section, the first hole H1 may have an area greater than that of the second hole H2. The first hole H1 may thus be inhibited from being formed to have an insufficient depth.

Furthermore, when viewed in horizontal section, the lower and intermediate portions of the support structure SS (or the first hole H1) may have a shape extending in the third direction D3 that does not face the center of the pad 110p (or the preliminary pad 115p) through which the support structure SS penetrates. As a result, a sufficient spacing may be provided between the contact plugs 140 and the support structures SS, and therefore the contact plugs 140 and the support structure SS may be inhibited/prevented from being connected to each other.

Although the present inventive concepts have been particularly shown and described with reference to example embodiments thereof, it will be understood by those of ordinary skill in the art that various changes in form and details may be made therein without departing from the spirit and scope of the present disclosure as defined by the following claims.

What is claimed is:

1. A semiconductor device comprising:
   a substrate comprising a cell array region and a connection region;
   a stack structure comprising a plurality of conductive layers stacked on the substrate, a first one of the plurality of conductive layers comprising a pad region that protrudes relative to an overlying second one of the plurality of conductive layers on the connection region;
   a vertical structure on the cell array region and penetrating the stack structure;
   a support structure penetrating the pad region; and
   a contact plug connected with a center of the pad region,
   wherein a first portion of the support structure extends in a first direction, intersecting a second direction that is toward the contact plug, in a first plane parallel to an upper surface of the substrate,
   wherein a second portion of the support structure extends in the first direction in a second plane that is at a lower level than the first plane, and
   wherein a first shape of the first portion of the support structure in the first plane is different from a second shape of the second portion of the support structure in the second plane.

2. The semiconductor device of claim 1, wherein, in a horizontal cross-sectional view, the first shape of the first portion of the support structure in the first plane and the second shape of the second portion of the support structure in the second plane comprise an elliptical shape comprising a major axis that extends in the first direction or a bar shape extending in the first direction.

3. The semiconductor device of claim 1, wherein a horizontal section of the first portion of the support structure in the first plane has a size larger than that of a horizontal section of the second portion of the support structure in the second plane.

4. The semiconductor device of claim 1,
   wherein the support structure is one among a plurality of support structures, and
   wherein the plurality of support structures comprise four support structures that are each adjacent to an edge of the pad region.

5. The semiconductor device of claim 4, wherein, in a horizontal cross-sectional view, the contact plug is located between the four support structures.

6. The semiconductor device of claim 4, wherein, in a horizontal cross-sectional view, the four support structures are symmetrical with each other about the contact plug.

7. The semiconductor device of claim 1, wherein the support structure comprises:
   a dummy lower semiconductor pattern on the substrate; and
   a dummy conductive pad on the dummy lower semiconductor pattern.

8. The semiconductor device of claim 7, wherein the support structure further comprises a dummy upper semiconductor pattern between the dummy lower semiconductor pattern and the dummy conductive pad.

9. The semiconductor device of claim 1, wherein the vertical structure comprises:
   a lower semiconductor pattern on the substrate;
   a conductive pad on the lower semiconductor pattern; and
   an upper semiconductor pattern between the lower semiconductor pattern and the conductive pad.

10. The semiconductor device of claim 1, wherein a lowermost surface of the support structure is in contact with the substrate.

11. The semiconductor device of claim 1,
    wherein the stack structure comprising a stepped structure on the connection region, and
    wherein the support structure penetrates the stepped structure on the connection region.

12. A semiconductor device comprising:
    a substrate;
    a stack structure comprising conductive layers stacked on the substrate, a first one of the conductive layers comprising a pad region that protrudes relative to an overlying second one of the conductive layers in a stepped region of the stack structure; and
    a support structure penetrating the pad region on the stepped region of the stack structure,
    wherein the support structure comprises:
    an elliptical shape, in a horizontal cross-sectional view, comprising a minor axis that extends in a first direction toward a center of the pad region; or
    a bar shape, in the horizontal cross-sectional view, extending in the first direction, and
    wherein a horizontal section of a first portion of the support structure in a first plane parallel to an upper surface of the substrate has a size larger than that of a horizontal section of a second portion of the support structure in a second plane that is at a lower level than the first plane.

13. The semiconductor device of claim 12, further comprising a contact plug comprising a conductive material that is on the center of the pad region.

14. The semiconductor device of claim 13,
  wherein the support structure is one among a plurality of support structures, and
  wherein the plurality of support structures comprise four support structures that are each adjacent to an edge of the pad region.

15. The semiconductor device of claim 14, wherein, in the horizontal cross-sectional view, the contact plug is located between the four support structures.

16. The semiconductor device of claim 14, wherein, in the horizontal cross-sectional view, the four support structures are symmetrical with each other about the contact plug.

17. The semiconductor device of claim 12, wherein the support structure comprises:
  a dummy lower semiconductor pattern on the substrate; and
  a dummy conductive pad on the dummy lower semiconductor pattern.

18. The semiconductor device of claim 17, wherein the support structure further comprises a dummy upper semiconductor pattern between the dummy lower semiconductor pattern and the dummy conductive pad.

19. The semiconductor device of claim 12, further comprising a vertical structure on the substrate and penetrating the stack structure,
  wherein the vertical structure comprises:
    a lower semiconductor pattern on the substrate;
    a conductive pad on the lower semiconductor pattern; and
    an upper semiconductor pattern between the lower semiconductor pattern and the conductive pad.

20. The semiconductor device of claim 12, wherein a lowermost surface of the support structure is in contact with the substrate.

* * * * *